(12) United States Patent
Teh et al.

(10) Patent No.: US 7,479,806 B2
(45) Date of Patent: Jan. 20, 2009

(54) SEMICONDUCTOR INTEGRATED CIRCUIT DEVICE

(75) Inventors: Chen Kong Teh, Tokyo (JP); Mototsugu Hamada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 11/476,106

(22) Filed: Jun. 28, 2006

(65) Prior Publication Data

US 2007/0024337 A1    Feb. 1, 2007

(30) Foreign Application Priority Data

Jun. 29, 2005  (JP)  ............................. 2005-190400
Jun. 7, 2006   (JP)  ............................. 2006-158893

(51) Int. Cl.
*H03K 19/096* (2006.01)
*H03K 3/12* (2006.01)

(52) U.S. Cl. ............................. 326/96; 326/98; 327/217

(58) Field of Classification Search .................. 326/68, 326/83, 95, 96, 98; 327/212, 215, 217–219
See application file for complete search history.

(56) References Cited

U.S. PATENT DOCUMENTS 5,764,089 A * 6/1998 Partovi et al. ............... 327/200

6,633,188 B1 * 10/2003 Jia et al. ..................... 327/217

OTHER PUBLICATIONS

Hamid Partovi, et al., "Flow-Through Latch and Edge-Triggered Flip-flop Hybrid Elements", ISSCC Digest of Technical Papers, Feb. 9, 1996, pp. 138-139.
Borivoje Nikolic, et al., "Improved Sense-Amplifier-Based Flip-Flop: Design and Measurements", IEEE Journal of Solid-State Circuits, vol. 35, No. 6, Jun. 2000, pp. 876-884.
James Tschanz, et al., "Comparative Delay and Energy of Single Edge-Triggered & Dual Edge-Triggered Pulsed Flip-Flops for High-Performance Microprocessors", Proceedings of the 2001 International Symposium on Low Power Electronics and Design, 2001, pp. 147-152.

* cited by examiner

*Primary Examiner*—James H Cho
(74) *Attorney, Agent, or Firm*—Oblon, Spivak, McClelland, Maier & Neustadt, P.C.

(57) ABSTRACT

The semiconductor integrated circuit device is a semiconductor integrated circuit device having a pulse generator and a latch circuit. The pulse generator has a first charge/discharge path and a second charge/discharge path and a charge unit for pre-charging first nodes. The first charge/discharge path and the second charge/discharge path include: two first switching units, connected to the first nodes, and configured to control, according to an input signal, conduction and non-conduction of the first charge/discharge path and the second charge/discharge path; and a second switching unit, disposed between a second node and a reference voltage node, and configured to be turned on in a period prior to capturing the input signal to allow an electric charge accumulated at the second node to be discharged to the reference voltage node, and at the same time, configured to be turned on in a period of capturing the input signal to allow the first node to discharge.

10 Claims, 15 Drawing Sheets

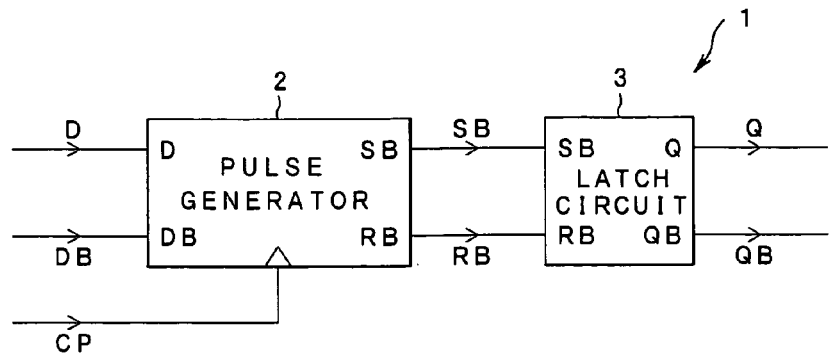

US 7,479,806 B2

SEMICONDUCTOR INTEGRATED CIRCUIT DEVICE

This application is based upon and claims the benefit of priority from the prior Japanese Patent Applications Nos 2005-190400, filed in Japan on Jun. 29, 2005 and 2006-158893, filed in Japan on Jun. 7, 2006; the entire contents of each of which are incorporated herein by their reference.

BACKGROUND OF THE INVENTION

1. Field of the Invention

The present invention relates to semiconductor integrated circuit devices, and more particularly to a semiconductor integrated circuit device having a flip-flop circuit.

2. Description of Related Art

Heretofore, flip-flop circuits have been broadly used in integrated circuits such as LSI. For the purpose of increasing the performance of integrated circuits, high speed operating flip-flop circuits have hitherto been proposed. Semiconductor integrated circuit devices constituted of such a high speed operating flip-flop circuit include one proposed in an article (Borivoje Nikolic, VojinG. Oklobdzija, Vladimir Stojanovic, Wenyan Jia, James Kar-Shing Chiu, and Michael Ming-Tak Leung, "Improved Sense-Amplifier-Based Flip-Flop: Design and Measurements", IEEE JOURNAL OF SOLID-STATE CIRCUITS, Vol. 35, NO. 6, June 2000 p876-p884) (hereinafter referred to as Document 1).

In the semiconductor integrated circuit device proposed in Document 1, however, due to the amount of electric charges accumulated in parasitic capacitance occurring on a path extending from a power source terminal to a reference voltage terminal in a signal generation circuit, speeding up of operation may be limited, thus causing a problem.

Further, in the semiconductor integrated circuit device proposed in Document 1, due to a status holding circuit, disposed in a latch circuit, for holding the status of output signal, the operating speed when the status of output signal is varied, may be reduced, thus causing a problem.

SUMMARY OF THE INVENTION

According to one aspect of the present invention, there is provided a semiconductor integrated circuit device having a pulse generator outputting according to a differential input signal, a set pulse signal and a reset pulse signal, and a latch circuit outputting according to the set pulse signal and the reset pulse signal, a differential output signal, the pulse generator including: a first charge/discharge path and a second charge/discharge path sharing part of a path; a charge unit, connected to the first charge/discharge path and the second charge/discharge path, and configured to pre-charge a first node acting as an output end of each of the set pulse signal and the reset pulse signal; two first switching units, disposed between the first node and a second node on the shared path, and configured to control according to the input signal, conduction and non-conduction of the first charge/discharge path and the second charge/discharge path, respectively; and a second switching unit, disposed between the second node and a reference voltage node, and configured to be turned on in a period prior to capturing the input signal to allow an electric charge accumulated in the second node to be discharged to the reference voltage node, and at the same time, configured to be turned on in a period of capturing the input signal to permit the first node to discharge.

BRIEF DESCRIPTION OF THE DRAWINGS

FIG. 1 is a block diagram of a semiconductor integrated circuit device employed in a first embodiment and a second embodiment of the present invention;

FIG. 2 is a view showing a truth table of operation of the semiconductor integrated circuit device shown in FIG. 1;

FIG. 3 is a view showing a truth table of operation of a latch circuit included in the semiconductor integrated circuit device shown in FIG. 1;

DETAILED DESCRIPTION OF THE INVENTION

Figure 4:
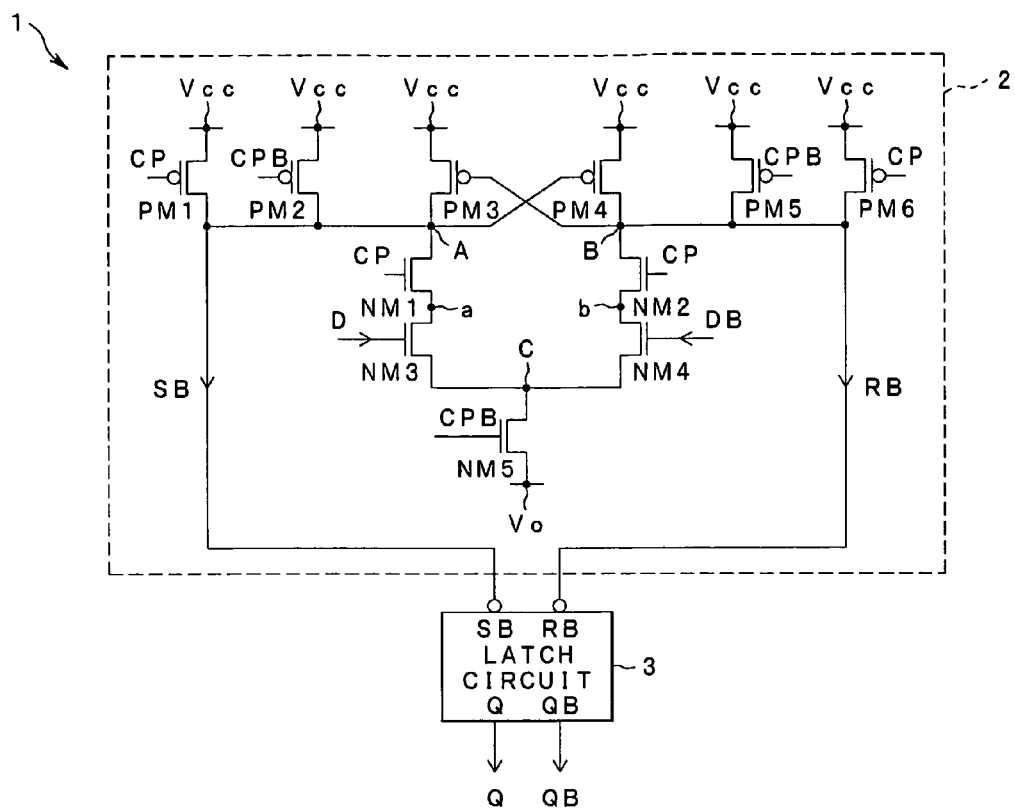
FIG. 4 is a view showing an example of a specific circuit configuration of a pulse generator included in the semiconductor integrated circuit device according to the first embodiment.

Embodiments of the present invention will be described below with reference to the drawings.

First Embodiment

FIG. 1 is a block diagram of a semiconductor integrated circuit device employed in a first embodiment and a second embodiment of the present invention.

The semiconductor integrated circuit device 1 employs a high speed flip-flop circuit configuration as shown in FIG. 1 and is constituted of a pulse generator 2 and a latch circuit 3.

As shown in FIG. 1, the pulse generator 2 acting as a signal generation circuit includes as its input end, a node (hereinafter referred to as a D input terminal) for receiving data signal D from the data input side of the semiconductor integrated circuit device 1, a node (hereinafter referred to as a DB input terminal) for receiving signal DB obtained by inverting signal D, and a node (hereinafter referred to as a CP input terminal) for receiving clock signal CP. Further, as its output end, a node (hereinafter referred to as an SB output terminal) for outputting set pulse signal SB and a node (hereinafter referred to as an RB output terminal) for outputting reset pulse signal RB generated based on the signals D and DB are included. The nodes at the output end of the pulse generator 2 are each connected to the input end of the latch circuit 3.

As shown in FIG. 1, the latch circuit 3 includes as its input end, a node (hereinafter referred to as an SB input terminal) for receiving signal SB and a node (hereinafter referred to as an RB input terminal) for receiving signal RB. Further, as its output end, a node (hereinafter referred to as a Q output terminal) for outputting output signal Q to the data output side of the semiconductor integrated circuit device 1, and a node (hereinafter referred to as a QB output terminal) for outputting signal QB obtained by inverting signal Q are included.

FIG. 2 is a view showing a truth table of operation of the semiconductor integrated circuit device shown in FIG. 1. Also, FIG. 3 is a view showing a truth table of operation of the latch circuit included in the semiconductor integrated circuit device shown in FIG. 1.

When triggered by signal CP, the semiconductor integrated circuit device 1 operates according to the truth value shown in FIG. 2. The latch circuit 3 is a so-called RS latch circuit and, when signals SB and RB are received, operates according to the truth value shown in FIG. 3. In the truth table shown in FIG. 2, reference character $Q_n$ denotes an output of signal Q when triggered by n-th signal CP, and $Q_{n-1}$ denotes an output of signal Q when triggered by (n−1)-th signal CP.

More specifically, when signal D of level L and signal DB of level L are received from the data input side, the semiconductor integrated circuit device 1 holds the output status of signals Q and QB each being an output signal, and outputting to the data output side is performed. When signal D of level L and signal DB of level H are received, signal Q is changed to level L and signal QB is changed to level H, and outputting to the data output side is performed. Also, when signal D of level H and signal DB of level L are received, signal Q is changed to level H and signal QB is changed to level L, and outputting to the data output side is performed.

Specifically, the pulse generator 2 is configured, for example as a circuit as shown in FIG. 4. FIG. 4 is a view showing an example of a specific circuit configuration of the pulse generator included in the semiconductor integrated circuit device according to the present embodiment.

Signal D received via the D input terminal of the pulse generator 2 is supplied to an N-channel type MOS transistor (hereinafter referred to as an NMOS transistor) NM3. Also, signal DB received via the DB input terminal of the pulse generator 2 is supplied to a gate of an NMOS transistor NM4.

In the NMOS transistor NM3, according to signal D supplied to the gate, the source/drain path between a source connected to a drain of an NMOS transistor NM5 via a node C and a drain connected to a source of an NMOS transistor NM1 is changed to a conduction (ON) state or a non-conduction (OFF) state.

In an NMOS transistor NM4 constituting, along with the NMOS transistor NM3, a differential pair, according to signal DB supplied to the gate, the source/drain path between a source connected to the drain of the NMOS transistor NM5 via the node C and a drain connected to a source of an NMOS transistor NM2 is turned on or turned off.

Signal CP received via the CP input terminal is supplied to respective gates of P-channel type MOS transistors (hereinafter referred to as a PMOS transistor) PM1 and PM6, and respective gates of the NMOS transistors NM1 and NM2.

Figure 5:
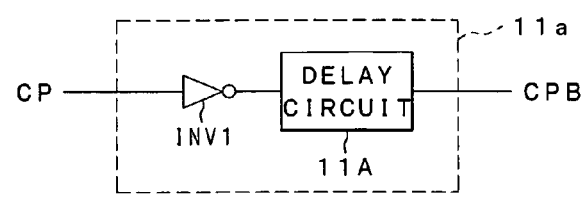
FIG. 5 is a view showing an exemplary circuit configuration of a delay/inverting circuit for generating and outputting a predetermined signal to the pulse generator included in the semiconductor integrated circuit device according to the first embodiment.
Figure 6:
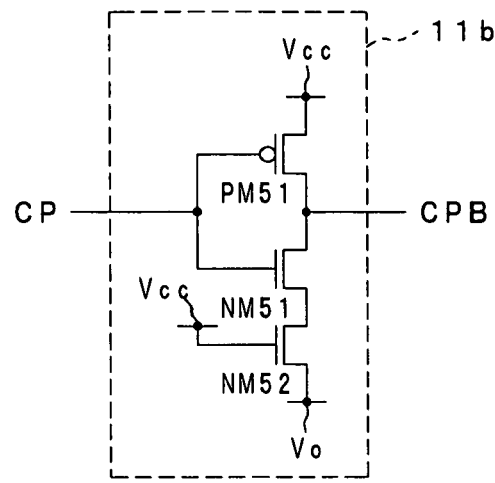
FIG. 6 is a view showing an example different from that of FIG. 5, of circuit configuration of the delay/inverting circuit for generating and outputting a predetermined signal to the pulse generator included in the semiconductor integrated circuit device according to the first embodiment.

FIG. 5 is a view showing an exemplary circuit configuration of a delay/inverting circuit for generating and outputting a predetermined signal to the pulse generator included in the semiconductor integrated circuit device according to the present embodiment. FIG. 6 is a view showing an example different from that of FIG. 5, of circuit configuration of the delay/inverting circuit for generating and outputting a predetermined signal to the pulse generator included in the semiconductor integrated circuit device according to the present embodiment.

Signal CPB is generated by delaying and inverting signal CP by a delay/inverting circuit 11a shown in FIG. 5 or a delay/inverting circuit 11b shown in FIG. 6. Signal CPB is supplied to respective gates of the PMOS transistors PM2 and PM5, and to a gate of the NMOS transistor NM5.

In the PMOS transistor PM1 acting as a charge unit, according to signal CP supplied to a gate thereof, the source/drain path between a source connected to a voltage supply terminal Vcc and a drain connected to a node A is turned on or turned off. When in an ON state, the PMOS transistor PM1 can pre-charge the node A. Also, the PMOS transistor PM1 is connected to the SB input terminal of the latch circuit 3. Accordingly, the signal level of signal SB is determined according to a voltage of the node A.

In the PMOS transistor PM2, according to signal CPB supplied to a gate thereof, the source/drain path between a source connected to a voltage supply terminal Vcc and a drain connected to the node A is turned on or turned off. Accordingly, when in an ON state, the PMOS transistor PM2 can pre-charge the node A.

In the PMOS transistor PM5, according to signal CPB supplied to a gate thereof, the source/drain path between a source connected to a voltage supply terminal Vcc and a drain connected to a node B is turned on or turned off. Accordingly, when in an ON state, the PMOS transistor PM5 can pre-charge the node B.

In the PMOS transistor PM6 acting as a charge unit, according to signal CP supplied to a gate thereof, the source/drain path between a source connected to a voltage supply terminal Vcc and a drain connected to the node B is turned on or turned off. When the source/drain path connected between the voltage supply terminal Vcc and the node B is in an ON state, the PMOS transistor PM6 can pre-charge the node B. Also, the PMOS transistor PM6 is connected to the RB input terminal of the latch circuit 3. Accordingly, the signal level of signal RB is determined according to a voltage of the node B.

As shown in FIG. 4, between the node A and a reference voltage terminal Vo and between the node B and the reference voltage terminal Vo, there are formed first and second charge/discharge paths.

As part of the first charge/discharge path, the NMOS transistors NM1 and NM3 are cascaded between the nodes A and C, and configured as one first switching unit for discharging the node A.

In the NMOS transistor NM1, according to signal CP supplied to the gate, the source/drain path between a source connected to the drain of the NMOS transistor NM3 and a drain connected to the node A is turned on or turned off.

As part of the second charge/discharge path, the NMOS transistors NM2 and NM4 are cascaded in a path between the nodes B and C, and configured as another first switching unit for discharging the node B.

In the NMOS transistor NM2, according to signal CP supplied to the gate, the source/drain path between the source connected to the drain of the NMOS transistor NM4 and the drain connected to the node B is turned on or turned off.

As part of the first and second charge/discharge paths, the NMOS transistor NM5 is connected between the node C and the reference voltage terminal Vo, and configured as part of a second switching unit for discharging the node C. More specifically, the first and second charge/discharge paths disposed between the nodes A and B and the reference voltage terminal Vo shares a path between the node C and the reference voltage terminal Vo.

In the NMOS transistor NM5, according to signal CPB supplied to a gate thereof, the source/drain path between a source connected to the reference voltage terminal Vo and the drain connected to the node C is turned on or turned off.

The delay/inverting circuit 11a shown in FIG. 5 being part of the second switching unit and a delay/inverting unit, is constituted of an inverter INV1 and a delay circuit 11A whose input end is connected to the output end of the inverter INV1. The inverter INV1 inverts signal CP supplied from the input end and outputs the resultant signal to the delay circuit 11A. The delay circuit 11A has a circuit configuration obtained, for example, by connecting an even number of inverters in series, and delays a received signal to output signal CPB.

Also, the delay/inverting circuit 11b shown in FIG. 6 is constituted of a PMOS transistor PM51 and NMOS transistors NM51 and NM52 cascaded between a voltage supply terminal Vcc and a reference voltage terminal Vo.

In the PMOS transistor PM51, according to signal CP supplied to a gate thereof, the source/drain path between a source connected to the voltage supply terminal Vcc and a drain connected to a drain of the NMOS transistor NM51 is turned on or turned off. In the NMOS transistor NM51, according to signal CP supplied to a gate thereof, the source/drain path between a source connected to a drain of the NMOS transistor NM52 and the drain connected to the drain of the PMOS transistor PM51 is turned on or turned off. In the NMOS transistor NM52, its gate is connected to the voltage supply terminal Vcc. Accordingly, the connection between the source connected to the reference voltage terminal Vo and the drain connected to the source of the NMOS transistor NM51 is in an ON state at all times.

In the delay/inverting circuit 11b shown in FIG. 6, when signal CP of level H is received, the NMOS transistor NM51 changes to an ON state, and the PMOS transistor PM51, to an OFF state. Thus, signal CPB of level L is outputted. Meanwhile, when signal CP of level L is received, the NMOS transistor NM51 changes to an OFF state, and the PMOS transistor PM51, to an ON state. Thus, signal CPB of level H is outputted.

In a PMOS transistor PM3, according to a voltage of the node B connected to a gate thereof, the source/drain path between a source connected to the voltage supply terminal Vcc and a drain connected to the node A is turned on or turned off. Accordingly, when the node B is at level L, the PMOS transistor PM3 is turned on to change the node A to level H.

In a PMOS transistor PM4, according to a voltage of the node A connected to a gate thereof, the source/drain path between a source connected to a voltage supply terminal Vcc and a drain connected to the node B is turned on or turned off. Accordingly, when the node A is at level L, the PMOS transistor PM4 is turned on to change the node B to level H.

In the pulse generator 2 shown in FIG. 4, for example, on a path performing connection between the voltage supply terminal Vcc and the reference voltage terminal Vo, an electric charge by pre-charge is accumulated in parasitic capacitance at the node A. Also, due to the NMOS transistor NM5 which is turned on in a period where signal CP is at level L and the NMOS transistor NM1 which is turned off, an electric charge by pre-charge is not accumulated in parasitic capacitance at the node C. Further, when signal D is at level H, the NMOS transistor NM3 changes to an ON state. Therefore, an electric charge by pre-charge is not accumulated in parasitic capacitance at a node a connected to the source of the NMOS transistor NM1 and the drain of the NMOS transistor NM3.

Also, in the pulse generator 2, for example, on a path performing connection between the voltage supply terminal Vcc and the reference voltage terminal Vo, an electric charge by pre-charge is accumulated in parasitic capacitance at the node B. Also, due to the NMOS transistor NM5 which is turned on in a period where signal CP is at level L and the NMOS transistor NM2 which is turned off, an electric charge by pre-charge is not accumulated in parasitic capacitance at the node C. Further, when signal DB is at level H, the source/drain path of the NMOS transistor NM4 changes to an ON state. Therefore, an electric charge by pre-charge is not accumulated in parasitic capacitance at a node b connected to the source of the NMOS transistor NM2 and the drain of the NMOS transistor NM4.

The first charge/discharge path disposed between the node A and the reference voltage terminal Vo, and the second charge/discharge path disposed between the node B and the reference voltage terminal Vo are not limited to the configuration described above in which the NMOS transistor NM5 acting as a switching unit is arranged on a path shared at the node C. In this case, switching units operating according to signal CPB may be arranged for respective charge/discharge paths.

Figure 7:
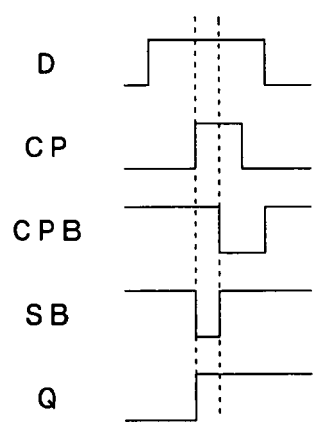
FIG. 7 is an operation timing chart of the semiconductor integrated circuit device according to the first embodiment.

Next, the operation of the semiconductor integrated circuit device 1 according to the present embodiment, for example when the pulse generator 2 as shown in FIG. 4 is employed as a specific circuit configuration, will now be described. It is noted that the operation described below of the pulse generator 2 is performed according to a time chart shown in FIG. 7. FIG. 7 is an operation timing chart of the semiconductor integrated circuit device according to the present embodiment.

The PMOS transistor PM1 is turned on in a period where signal CP supplied to the gate is at level L. Thus, conduction between the voltage supply terminal Vcc and the node A is made to pre-charge the node A. Accordingly, signal SB of level H is supplied to the SB input terminal of the latch circuit 3.

Also, the source/drain path of the PMOS transistor PM6 is turned on. Thus, conduction between the voltage supply terminal Vcc and the node B is made to pre-charge the node B. Accordingly, signal RB of level H is supplied to the RB input terminal of the latch circuit 3.

When the node A and node B are at level H, both the PMOS transistors PM3 and PM4 are in an OFF state.

Further, at the node C of the pulse generator 2, before signal D and signal DB are received, the NMOS transistor NM5 is turned on in a period where signal CP is at level L. Thus, conduction between the reference voltage terminal Vo and the node C is made to change the node C to level L. Accordingly, no electric charge is accumulated in parasitic capacitance occurring at the node C.

Afterward, when signal CP is changed to level H, both the NMOS transistors NM1 and NM2 are turned on. Then, one of the NMOS transistor NM3 and NMOS transistor NM4 constituting a differential pair is turned on by signal D and signal DB received, whereby conduction to the node C is made. For example, when signal D of level H and signal DB of level L are received from the data input side, the NMOS transistor NM3 changes to an ON state and the NMOS transistor NM4 changes to an OFF state.

Inverted signal CPB obtained by delaying signal CP is generated in the delay/inverting circuit 11a shown in FIG. 5 or in the delay/inverting circuit 11b shown in FIG. 6. Therefore, as shown in the time chart of FIG. 7, signal CPB holds level H for a predetermined time period even after signal CP of level H is received.

More specifically, in an input signal capturing period where both signal CP and signal CPB are at level H (hereinafter, the period where signal CPP is at level H is also referred as a transition period), the PMOS transistors PM1, PM2 and PM3 change to an OFF state, and the NMOS transistors NM1 and NM5 change to an ON state. Accordingly, conduction between the node A and the reference voltage terminal Vo is made to discharge the electric charge which has been pre-charged at the node A, whereby the node A changes to level L. At this time, no electric charge is accumulated in parasitic capacitance occurring at the node C, and at the same time, no electric charge is accumulated in the drain of the NMOS transistor NM3, i.e., in parasitic capacitance at the node a. Therefore, only the electric charge accumulated at the node A is discharged. Accordingly, the node A is changed from level H to level L by discharging of a relatively small amount of electric charges, so the change at the node A is performed relatively sharply. Meanwhile, the NMOS transistor NM4 is in an OFF state even when both signal CP and signal CPB are at level H. Thus, the electric charge pre-charged at the node B is not discharged, and level H is held.

When the node A is at level L and at the same time, the node B is at level H, then the PMOS transistor PM3 changes to an OFF state, and the PMOS transistor PM4 changes to an ON state. Accordingly, by virtue of the presence of the node B being at level H, the pulse generator 2 has properties such that both set-up time and hold time are shortened, as compared to conventional art.

In a status where the node A is determined as being at level L, signal SB of level L is outputted and at the same time, signal RB of level H is outputted.

When signal SB of level L and signal RB of level H are received, the latch circuit 3 outputs signal Q of level H and signal QB of level L to the data output side.

The length of time taken for signal Q to change from level L to level H increases substantially in proportion to the length of time taken for logical value based on signal SB to be inverted. Also, the length of time taken for signal SB to change from level H to level L increases substantially in proportion to the amount of electric charges accumulated in parasitic capacitance on a path performing connection between the voltage supply terminal and reference voltage terminal. Therefore, the smaller the amount of electric charges accumulated in the parasitic capacitance is, the shorter the length of time taken from when signal D is received to when signal Q is outputted is. That is, as the amount of electric charges accumulated in the parasitic capacitance is reduced, the semiconductor integrated circuit device 1 can operate at a faster speed. More specifically, in the semiconductor integrated circuit device 1 according to the present embodiment, the pulse generator 2 has a circuit configuration such that only one node has electric charge capable of being discharged as described above, whereby high-speed operation can be performed.

Afterward, signal CPB of level L is supplied to the gates of the PMOS transistors PM2 and PM5 and the NMOS transistor NM5. Accordingly, the PMOS transistors PM2 and PM5 change to an ON state, and the NMOS transistor NM5 changes to an OFF state.

When the source/drain path of the PMOS transistor PM2 changes to an ON state, conduction between the voltage supply terminal Vcc and node A is made. Thus, an electric charge supplied from the voltage supply terminal Vcc is pre-charged at the node A and at the same time, the node A changes to level H. When the node A changes to level H, signal SB of level H is supplied to the latch circuit 3.

When signals SB and RB of level H are received, the latch circuit 3 outputs to the data output side, signal Q and signal QB held respectively at level H and level L.

Figure 8:
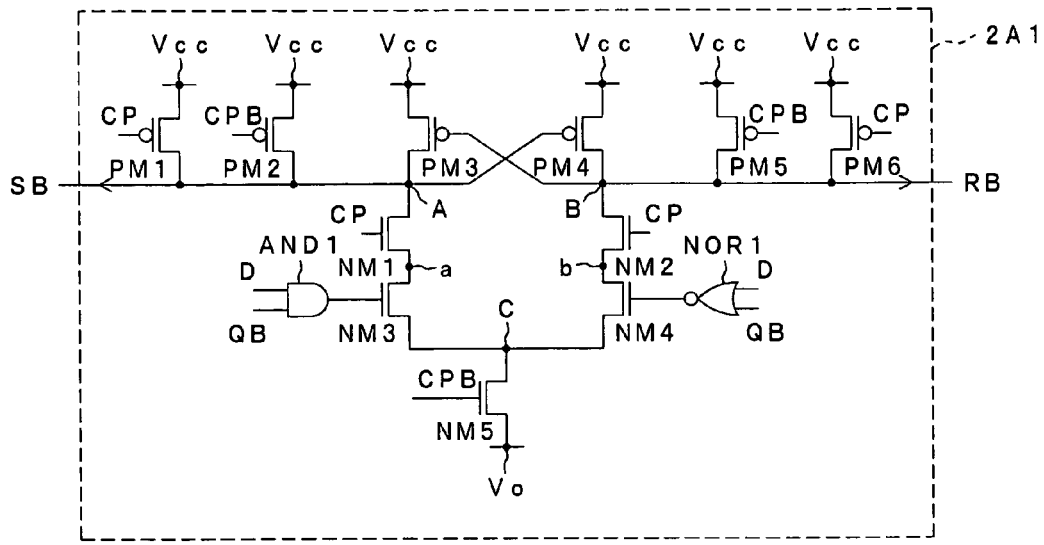
FIG. 8 is a view showing a circuit configuration as a variation of the pulse generator of FIG. 4.

The pulse generator 2 may be constituted as a pulse generator 2A1 as shown in FIG. 8. FIG. 8 is a view showing a circuit configuration as a variation of the pulse generator of FIG. 4. The pulse generator 2A1 has a configuration such that when signal D having the same logical value as signal Q is received, redundant internal transition can be eliminated.

In addition to the configuration of the pulse generator 2 shown in FIG. 4, the pulse generator 2A1 acting as a signal generation circuit further includes as an input end, a node (hereinafter referred to as a QB input terminal) for receiving signal QB outputted from the latch circuit 3.

Further, an AND logic circuit AND1 whose input end is connected to a D input terminal and a QB input terminal, and an NOR logic circuit NOR1 whose input end is connected to a D input terminal and a QB input terminal are included. The AND logic circuit AND1 outputs an output signal dependent on received signal D and signal QB to a gate of an NMOS transistor NM3 connected to an output terminal thereof. The NOR logic circuit NOR1 outputs an output signal dependent on received signal D and signal QB to a gate of an NMOS transistor NM4 connected to an output terminal thereof.

By way of example, a case where signal D of level H is received in a status where signal QB is at level L, will be studied. In this case, both the NMOS transistors NM3 and NM4 change to an OFF state. Thus, neither electric charge pre-charged at the node A nor electric charge pre-charged at the node B is discharged, and both the node A and node B are held at level H. Accordingly, the pulse generator 2A1 has properties and advantageous effects similar to those of the pulse generator 2 and at the same time, can operate, by eliminating redundant internal transition, with its power consumption reduced as compared to the pulse generator 2.

Figure 9:
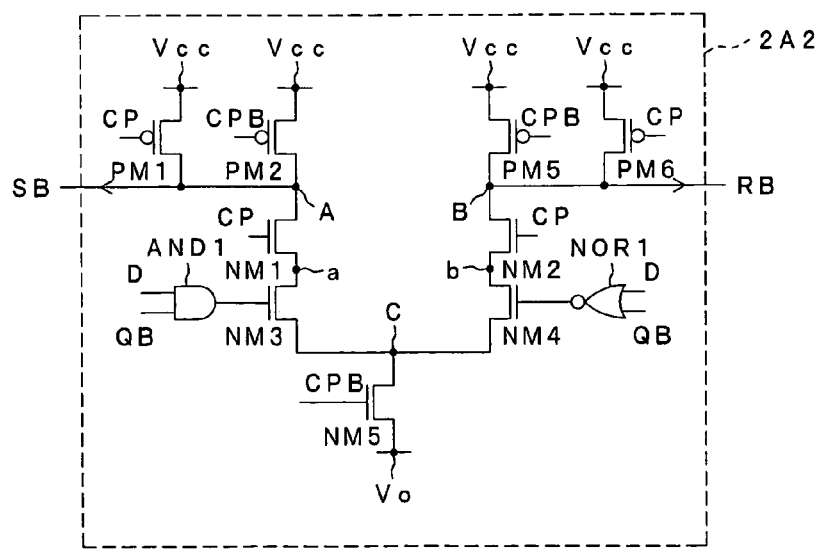
FIG. 9 is a view showing a circuit configuration different from that of FIG. 8 as a variation of the pulse generator of FIG. 4.

Also, the pulse generator 2 may be constituted as a pulse generator 2A2 as shown in FIG. 9. FIG. 9 is a view showing a circuit configuration different from that of FIG. 8 as a variation of the pulse generator of FIG. 4. The pulse generator 2A2 has a configuration substantially similar to a configuration in which the PMOS transistors PM3 and PM4 are removed from the pulse generator 2A1 of FIG. 8. Also, as the input end, a D input terminal and a QB input terminal are included in the data input side of the semiconductor integrated circuit device 1.

Since the pulse generator 2A2 has the AND logic circuit AND1 and NOR logic circuit NOR1 as described above, a state where the NMOS transistors NM3 and NM4 are simultaneously turned on, i.e., a case where the node A and node B simultaneously change to level L, can be eliminated. Further, similarly to the pulse generator 2A1, the pulse generator 2A2 has properties such that both set-up time and hold time are shortened, as compared to conventional art.

Also, the pulse generator 2A2 can achieve advantageous effects similar to those of the pulse generator 2 of FIG. 4 and the pulse generator 2A1 of FIG. 8. Further, as compared to the pulse generators 2 and 2A1, the pulse generator 2A2 uses only a small number of transistors required for the circuit configuration, and can thus be operated by smaller electric power.

As described above, in the pulse generator 2 used in the semiconductor integrated circuit device 1 according to the present embodiment, there are only three nodes at which parasitic capacitance occurs, on one path performing connection between the voltage supply terminal and reference voltage terminal. Also, in the pulse generator 2 of the present embodiment, no electric charge capable of being discharged is accumulated in two nodes which conduct to the reference voltage terminal, among the three nodes at which parasitic capacitance occurs. Accordingly, the semiconductor integrated circuit device 1 of the present embodiment has smaller electric charge amount on the one path, as compared to the conventional semiconductor integrated circuit devices in which electric charge is accumulated at least three nodes; therefore, the length of time taken for logical value based on output signal to be inverted can be shortened. Consequently, the semiconductor integrated circuit device 1 of the present embodiment can operate at a faster speed, as compared to the conventional semiconductor integrated circuit devices.

It is noted here that the circuit configuration shown in FIGS. 4, 8 and 9 of the pulse generator included in the semiconductor integrated circuit device 1 of the present embodiment is an exemplary specific circuit configuration, and the present invention is not limited to the circuit configuration according to the present embodiment described above. Therefore, if the pulse generator included in the semiconductor integrated circuit device 1 of the present embodiment has an operation similar to that described above, various changes or modifications to the circuit configuration thereof are possible without departing from the gist of the invention.

Second Embodiment

FIGS. 10 to 16 relate to a second embodiment of the present invention. A detailed explanation of parts having a configuration similar to that of the first embodiment is omitted. Also, the same reference numerals are applied to constituent elements corresponding to the first embodiment, and an explanation thereof is omitted.

Figure 10:
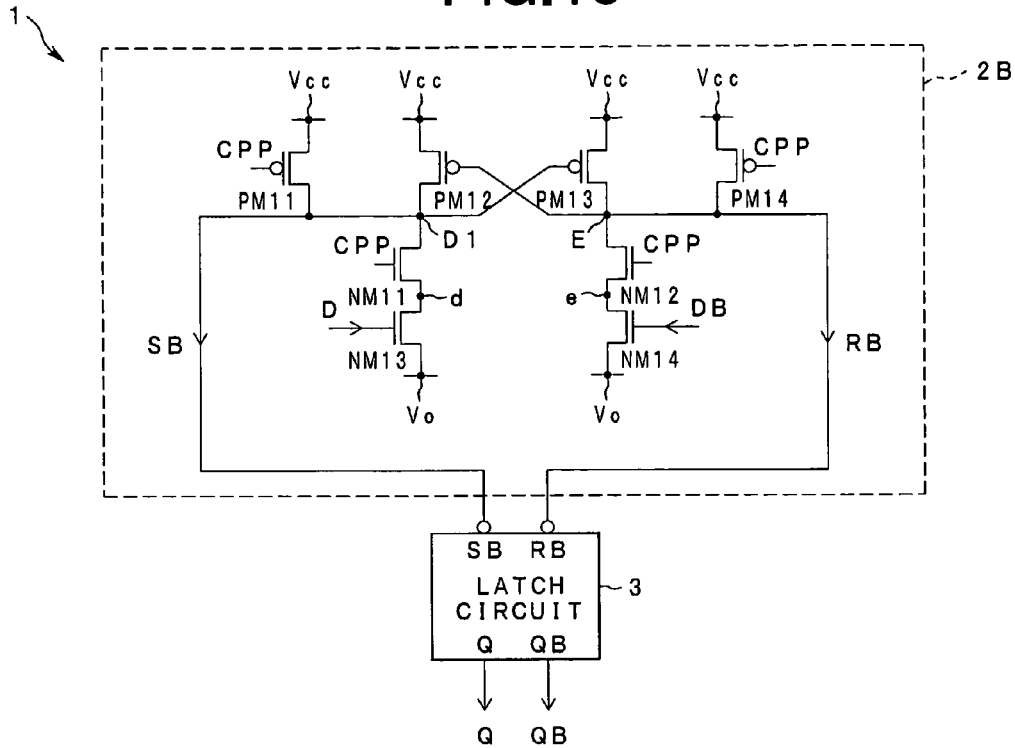
FIG. 10 is a view showing an example of a specific circuit configuration of a pulse generator included in a semiconductor integrated circuit device according to the second embodiment.

FIG. 10 is a view showing an example of a specific circuit configuration of a pulse generator included in a semiconductor integrated circuit device according to the present embodiment. As shown in FIG. 10, the semiconductor integrated circuit device 1 of the present embodiment has a pulse generator 2B and a latch circuit 3. The semiconductor integrated circuit device 1 operates according to the truth value as shown in FIG. 2. The latch circuit 3 of the present embodiment operates according to the truth value as shown in FIG. 3.

Similarly to the pulse generator 2 of the first embodiment, the pulse generator 2B included in the semiconductor integrated circuit device 1 of the present embodiment has an input end including a D input terminal, a DB input terminal and a CP input terminal, and an output end including an SB output terminal and an RB output terminal.

Specifically, the pulse generator 2B included in the semiconductor integrated circuit device 1 of the present embodiment has a circuit configuration as shown in FIG. 10.

In an NMOS transistor NM13, according to signal D supplied to a gate thereof, the source/drain path between a source connected to a reference voltage terminal Vo and a drain connected to a source of an NMOS transistor NM11 is turned on or turned off.

In an NMOS transistor NM14 constituting, along with the NMOS transistor NM13, a differential pair, according to signal DB supplied to a gate thereof, the source/drain path between a source connected to a reference voltage terminal Vo and a drain connected to a source of an NMOS transistor NM12 is turned on or turned off.

PMOS transistors PM11 and PM14, and NMOS transistors NM11 and NM12 of the pulse generator 2B shown in FIG. 10 each operate when signal CPP is supplied to respective gates.

Figure 11:
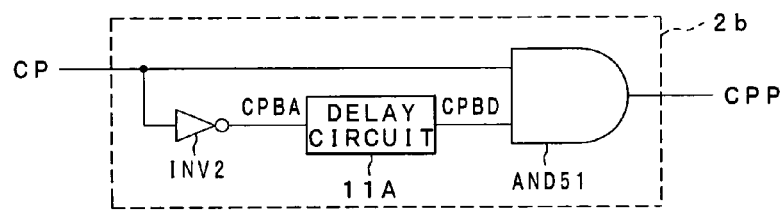
FIG. 11 is a view showing an exemplary circuit configuration of a pulsed clock generation circuit included in the semiconductor integrated circuit device according to the second embodiment.

Signal CPP is a signal generated according to signal CP by a pulsed clock generation circuit 2b shown in FIG. 11. FIG. 11 is a view showing an exemplary circuit configuration of the pulsed clock generation circuit included in the semiconductor integrated circuit device according to the present embodiment. The pulsed clock generation circuit 2b shown in FIG. 11 is constituted of an inverter INV2, a delay circuit 11A whose input end is connected to an output end of the inverter INV2, and an AND logic circuit AND51.

The inverter INV2 inverts signal CP received from the input end to produce signal CPBA and outputs it to the delay circuit 11A. The delay circuit 11A has a circuit configuration obtained, for example, by connecting an even number of inverters in series, and delays signal CPBA outputted from the inverter IV2 to produce signal CPBD and outputs it to an input end of the AND logic circuit AND51. The AND logic circuit AND51 generates and outputs according to signal CP and signal CPBD received from the input end, signal CPP which changes to level H in a period where both signal CP and signal CPBD are at level H.

Figure 13:
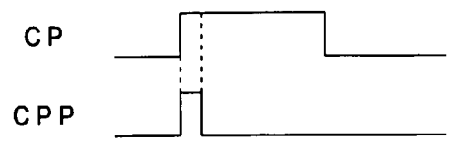
FIG. 13 is an operation timing chart of the pulsed clock generation circuit of FIG. 11.

As described above, in the pulsed clock generation circuit 2b shown in FIG. 11, for example as shown in a timing chart of FIG. 13, signal CPP having a narrower pulse width than signal CP is generated and outputted. FIG. 13 is an operation timing chart of the pulsed clock generation circuit of FIG. 11.

Figure 12:
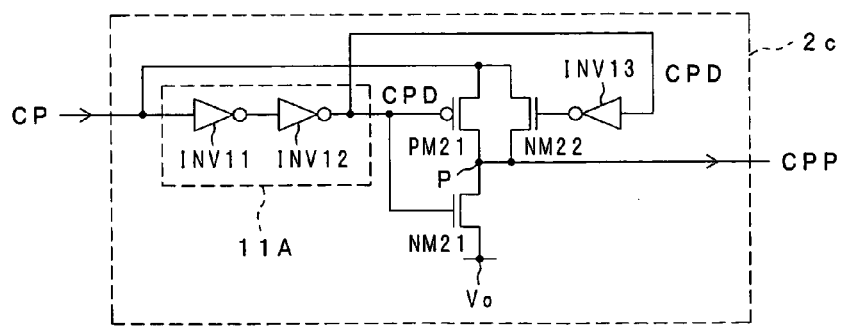
FIG. 12 is a view showing an example different from that of FIG. 11, of circuit configuration of the pulsed clock generation circuit included in the semiconductor integrated circuit device according to the second embodiment.

Signal CPP is not limited to one generated by the pulsed clock generation circuit 2b shown in FIG. 11, and may be generated, for example, by a pulsed clock generation circuit 2c shown in FIG. 12. FIG. 12 is a view showing an example different from that of FIG. 11, of circuit configuration of the pulsed clock generation circuit included in the semiconductor integrated circuit device according to the present embodiment.

The pulsed clock generation circuit 2c is constituted of a delay circuit 11A, a PMOS transistor PM21, an NMOS transistor NM21, an NMOS transistor NM22 and an inverter INV13. The delay circuit 11A has a circuit configuration obtained, for example, by connecting an even number of inverters in series. In FIG. 12, the delay circuit 11A is constituted of an inverter INV11 and an inverter INV12.

A CP input terminal is connected to an input end of the inverter INV11, a source of the PMOS transistor PM21 and a drain of the NMOS transistor NM22. An output end of the inverter INV11 is connected to an input end of the inverter INV12. An output end of the inverter INV12 is connected to respective gates of the PMOS transistor PM21 and NMOS transistor NM21, and to an input end of the inverter INV13.

In the PMOS transistor PM21, according to signal CPD outputted from the inverter INV12, the source/drain path between a source connected to the CP input terminal and a drain connected to a drain of the NMOS transistor NM21 is turned on or turned off. More specifically, in a period where signal CPD outputted from the inverter INV12 is at level L, the PMOS transistor PM21 allows passage of signal CP; in a period where signal CPD is at level H, the PMOS transistor PM21 cuts off signal CP.

An output end of the inverter INV13 is connected to a gate of the NMOS transistor NM22. In the NMOS transistor NM22, according to a signal outputted from the inverter INV13 and supplied to the gate thereof, the source/drain path between a source connected to the CP input terminal and a drain connected to the drain of the NMOS transistor NM21 is turned on or turned off. More specifically, in a period where the signal outputted from the inverter INV13 is at level L, the NMOS transistor NM22 cuts off signal CP; in a period where the above signal is at level H, the NMOS transistor NM22 allows passage of signal CP.

In the NMOS transistor NM21, according to signal CPD supplied to the gate thereof, the source/drain path between the source connected to a reference voltage terminal Vo and the drain connected to the drain of the PMOS transistor PM21 is turned on or turned off. More specifically, in a period where signal CPD outputted from the inverter INV12 is at level L, the NMOS transistor NM21 allows signal CP to be outputted to the output side of the pulsed clock generation circuit 2b. Accordingly, when signal CP changes from level L to level H, the node P changes to level H, so a signal of level H is outputted to the output side of the pulsed clock generation circuit 2b.

Also, in a period where signal CPD outputted from the inverter INV12 is at level H, the NMOS transistor NM21 allows conduction between the node P and reference voltage terminal Vo. Accordingly, the node P changes to level L, so a signal of level L is outputted to the output side of the pulsed clock generation circuit 2b.

Figure 14:
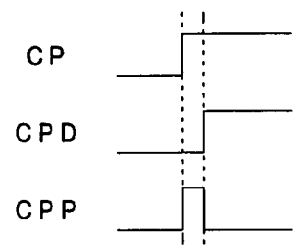
FIG. 14 is an operation timing chart of the pulsed clock generation circuit of FIG. 12.

As described above, in the pulsed clock generation circuit 2c shown in FIG. 12, for example, as shown in a timing chart of FIG. 14, pulse signal CPP having a narrower pulse width than that of signal CP is generated and outputted. FIG. 14 is an operation timing chart of the pulsed clock generation circuit of FIG. 12.

Signal CPP outputted from the pulsed clock generation circuit 2b to the pulse generator 2B is supplied to respective gates of the PMOS transistors PM11 and PM14 and the NMOS transistors NM11 and NM12.

In the PMOS transistor PM11 acting as a charge unit, according to signal CPP supplied to a gate thereof, the source/drain path between a source connected to a voltage supply terminal Vcc acting as a power source terminal and a drain connected to a node D1 is turned on or turned off. Also, the drain of the PMOS transistor PM11 is connected to the SB input terminal of the latch circuit 3. Accordingly, by changing to an ON state or an OFF state, the source/drain path connected between the voltage supply terminal Vcc and node D1, the PMOS transistor PM11 can vary the signal level of signal SB dependent on a voltage of the node D1. Further, by changing to an ON state, the path between the voltage supply terminal Vcc and node D1 according to signal CPP, the PMOS transistor PM11 can pre-charge the node D1 where parasitic capacitance occurs.

In the PMOS transistor PM14 acting as a charge unit, according to signal CPP supplied to a gate thereof, the source/drain path between a source connected to a voltage supply terminal Vcc acting as a power source terminal and a drain connected to a node E is turned on or turned off. Also, the drain of the PMOS transistor PM14 is connected to the RB input terminal of the latch circuit 3. Accordingly, by changing to an ON state or an OFF state, the path between the voltage supply terminal Vcc and node E, the PMOS transistor PM14 can vary the signal level of signal RB dependent on a voltage of the node E. Further, by changing to an ON state, the path between the voltage supply terminal Vcc and node E according to signal CPP, the PMOS transistor PM14 can pre-charge the node E where parasitic capacitance occurs.

In the NMOS transistor NM11, according to signal CPP supplied to a gate thereof, the source/drain path between a source connected to a drain of the NMOS transistor NM13 and a drain connected to the node D1 is turned on or turned off.

The NMOS transistor NM11 and NMOS transistor NM13 are cascaded in a path, which acts as a charge/discharge path, between the node D1 and reference voltage terminal Vo, and configured as a switching unit for discharging the node D1.

In the NMOS transistor NM12, according to signal CPP supplied to a gate thereof, the source/drain path between a source connected to a drain of the NMOS transistor NM14 and a drain connected to the node E is turned on or turned off.

The NMOS transistor NM12 and NMOS transistor NM14 are cascaded in a path, which acts as a charge/discharge path, between the node E and reference voltage terminal Vo, and configured as a switching unit for discharging the node E.

In a PMOS transistor PM12, according to a voltage of the node E connected to a gate thereof, the source/drain path between a source connected to the voltage supply terminal Vcc and a drain connected to the node D1 is turned on or turned off. More specifically, when the node E is at level L, the PMOS transistor PM12 changes to an ON state, and the node D changes to level H.

In a PMOS transistor PM13, according to a voltage of the node D1 connected to a gate thereof, the source/drain path between a source connected to a voltage supply terminal Vcc and a drain connected to the node E is turned on or turned off. More specifically, when the node D1 is at level L, the PMOS transistor PM13 changes to an ON state, and the node E changes to level H.

In the pulse generator 2B having a circuit configuration as described above, for example on a path performing connection between the voltage supply terminal Vcc and reference voltage terminal Vo, there are only two nodes (node D1 and node d) where parasitic capacitance occurs. Also, in the pulse generator 2B, for example on a path performing connection between the voltage supply terminal Vcc and reference voltage terminal Vo, there are only two nodes (node E and node e) where parasitic capacitance occurs.

Figure 15:
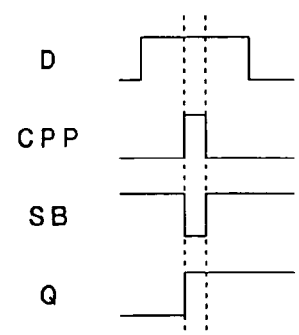
FIG. 15 is an operation timing chart of the semiconductor integrated circuit device according to the second embodiment.

The operation of the semiconductor integrated circuit device 1 according to the present embodiment, for example, when the pulse generator 2B as shown in FIG. 10 is employed as a specific circuit configuration, will now be described. It is noted that the operation described below of the pulse generator 2B is performed according to a time chart shown in FIG. 15. FIG. 15 is an operation timing chart of the semiconductor integrated circuit device according to the present embodiment.

In a period where the signal level of signal CPP supplied to the gate is at level L, the source/drain path of the PMOS transistor PM11 is turned on. Thus, conduction between the voltage supply terminal Vcc and node D1 is made, and the node D1 changes to level H. Accordingly, signal SB of level H is supplied to the SB input terminal of the latch circuit 3. Also, in this state, by pre-charging the node D1, the PMOS transistor PM11 changes the node D1 to level H.

Also, in a period where signal CPP supplied to the gate is at level L (hereinafter, also referred to as a pre-charge period), the PMOS transistor PM14 is turned on. Thus, conduction between the voltage supply terminal Vcc and node E is made, and the node E changes to level H. Accordingly, signal RB of level H is supplied to the RB input terminal of the latch circuit 3. Also, in this state, by pre-charging the node E, the PMOS transistor PM14 changes the node E to level H.

In a status where the node D1 and node E are at level H, both the PMOS transistors PM12 and PM13 are turned off.

Afterward, in an input signal capturing period where signal CPP changes to level H, both the NMOS transistors NM11 and NM12 are turned on. Also, one of the NMOS transistors NM13 and NM14 constituting a differential pair is turned on by signal D and signal DB received.

For example, when signal D of level H and signal DB of level L are received from the data input side, the NMOS transistor NM13 is turned on, so an electric charge by pre-charge is not accumulated in parasitic capacitance at the node d. Also, at this time, the NMOS transistor NM14 is turned off.

More specifically, in a status where both signal CPP and signal D are at level H, conduction between the node D1 and reference voltage terminal Vo is made, and an electric charge which has been pre-charged at the node D1 is discharged, and the node D1 changes to level L. At this time, no electric charge is accumulated at the node d. Therefore, the electric charge to be discharged is accumulated only at the node D1. More specifically, discharge of a relatively small amount of electric charges causes the node D1 to change from level H to level L, so the change at the node D1 is performed relatively sharply. Meanwhile, the NMOS transistor NM14 is in an OFF state, so an electric charge pre-charged at the node E is not discharged, whereby the node E holds level H.

When the node D1 is at level L and at the same time, the node E is at level H, the PMOS transistor PM12 is turned off, and the PMOS transistor PM13 is turned on. Accordingly, by virtue of the presence of the node E being at level H, the pulse generator 2B has properties such that both set-up time and hold time are shortened, as compared to conventional art.

When the node D1 is determined as being at level L, signal SB of level L is outputted. Meanwhile, when the node E is determined as being at level H, signal RB of level H is outputted. When signal SB of level L and signal RB of level H are received, the latch circuit 3 outputs signal Q of level H and signal QB of level L to the data output side.

The length of time taken for signal Q to change from level L to level H increases substantially in proportion to the length of time taken for logical value based on signal SB to be inverted. Also, the length of time taken for signal SB to change from level H to level L increases substantially in proportion to the amount of electric charges accumulated in parasitic capacitance (when the amount of current is identical) on one path performing connection between the voltage supply terminal and reference voltage terminal. Therefore, the smaller the amount of electric charges accumulated in the parasitic capacitance is, the shorter the length of time taken from when signal D is received to when signal Q is outputted is. That is, as the amount of electric charges accumulated in the parasitic capacitance is reduced, the semiconductor integrated circuit device 1 can operate at a faster speed. In the semiconductor integrated circuit device 1 of the present embodiment, the pulse generator 2B has a circuit configuration such that only one node has electric charge capable of being discharged as described above, whereby high-speed operation can be performed.

Afterward, when signal CPP changes from level H to level L, signal CPP of level L is supplied to respective gates of the PMOS transistors PM11 and PM14 and the NMOS transistors NM11 and NM12. Accordingly, the PMOS transistors PM11 and PM14 change to an ON state, and the NMOS transistors NM11 and NM12 change to an OFF state. When the PMOS transistor PM11 changes to an ON state, conduction between the voltage supply terminal Vcc and node D1 is made. Thus, the voltage of the voltage supply terminal Vcc is pre-charged at the node D1 and at the same time, the node D1 changes to level H. When the node D1 changes to level H, signal SB of level H is supplied to the latch circuit 3. Also, according to the voltage of the node E, signal RB of level H is supplied to the latch circuit 3.

When signal SB and signal RB of level H are received, the latch circuit 3 outputs to the data output side, signal Q and signal QB held respectively at level H and level L.

Figure 16:
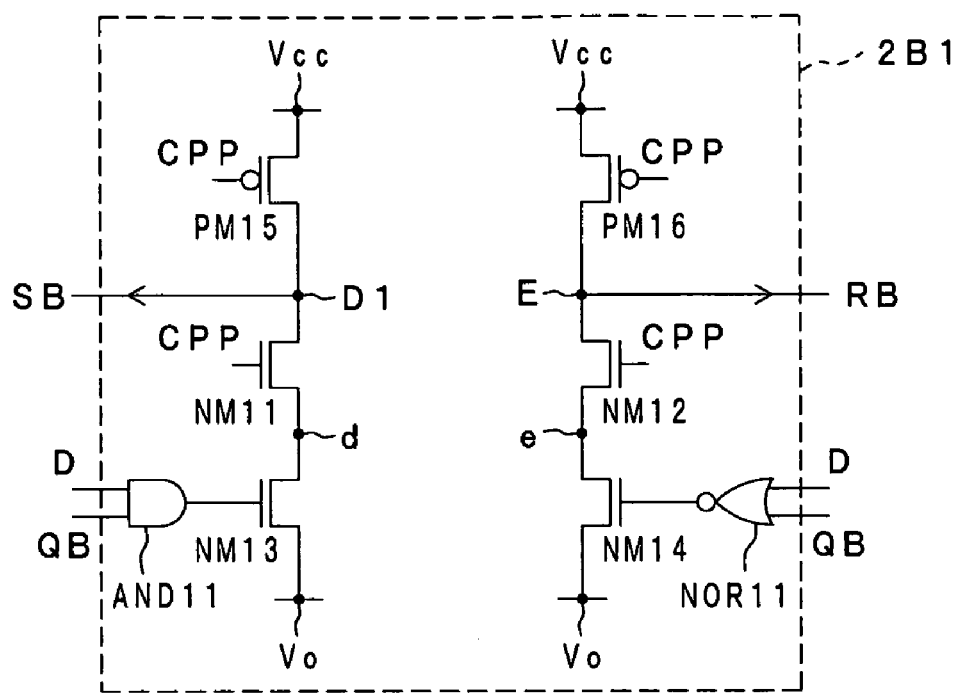
FIG. 16 is a view showing a circuit configuration as a variation of the pulse generator of FIG. 10.

Also, the pulse generator 2 may be one constituted as a pulse generator 2B1 as shown in FIG. 16. FIG. 16 is a view showing a circuit configuration as a variation of the pulse generator of FIG. 10. The pulse generator 2B1 as shown in FIG. 16 has a configuration substantially similar to a configuration in which the PMOS transistors PM12 and PM13 are removed from the pulse generator 2B of FIG. 10. Also, the pulse generator 2B1 has, as the input end, a D input terminal and a QB input terminal in the data input side of the semiconductor integrated circuit device 1.

In a PMOS transistor PM15 acting as a charge unit, according to signal CPP supplied to a gate thereof, the source/drain path between a source connected to a voltage supply terminal Vcc acting as a power source terminal and a drain connected to a node D1 is turned on or turned off. Accordingly, in the PMOS transistor PM15, according to signal CPP, connection between the voltage supply terminal Vcc and node D1 is turned on, whereby the node D1 where parasitic capacitance occurs can be pre-charged.

In a PMOS transistor PM16 acting as a charge unit, according to signal CPP supplied to a gate thereof, the source/drain path between a source connected to a voltage supply terminal Vcc acting as a power source terminal and a drain connected to a node E is turned on or turned off. Accordingly, in the PMOS transistor PM16, according to signal CPP, connection between the voltage supply terminal Vcc and node E is turned on, whereby the node E where parasitic capacitance occurs can be pre-charged.

Also, the pulse generator 2B1 has an AND logic circuit AND11 whose input end is connected to a D input terminal and a QB input terminal, and an NOR logic circuit NOR11 whose input end is connected to a D input terminal and a QB input terminal.

The AND logic circuit AND11 outputs an output signal dependent on signal D and signal QB to a gate of an NMOS transistor NM13 connected to an output terminal thereof.

The NOR logic circuit NOR11 outputs an output signal dependent on signal D and signal QB to a gate of an NMOS transistor NM14 connected to an output terminal thereof.

Also, the pulse generator 2B1 shown in FIG. 16 has advantageous effects similar to those of the pulse generator 2B of FIG. 10. Further, in the pulse generator 2B1, when signal D having the same logical value as signal Q is received, the NMOS transistors NM13 and NM14 are turned off. Therefore, by eliminating redundant internal transition, the pulse generator 2B1 can operate with its power consumption reduced as compared to the pulse generator 2B.

Further, the pulse generator 2B1 uses only a small number of transistors required for circuit configuration, as compared to the pulse generator 2B, and can thus operate by a smaller amount of electric power.

As described above, in the pulse generator used in the semiconductor integrated circuit device 1 according to the present embodiment, there is only one node at which an electric charge is accumulated, on one path performing connection between the voltage supply terminal and reference voltage terminal. Therefore, as compared to the conventional semiconductor integrated circuit devices in which, on the one path, there are at least three nodes at which an electric charge is accumulated, in the case of the semiconductor integrated circuit device 1 of the present embodiment, the amount of electric charges is smaller, so the length of time taken for logical value based on output signal to be inverted can be shortened. Consequently, the semiconductor integrated circuit device 1 of the present embodiment can operate at a faster speed than the conventional semiconductor integrated circuit devices do.

It is noted that the circuit configuration of the pulse generator shown in FIGS. 10 and 16, and of the pulsed clock generation circuit shown in FIG. 11 is an exemplary specific circuit configuration, and the present invention is not limited only to the circuit configuration according to the present embodiment described above. Therefore, if the pulse generator included in the semiconductor integrated circuit device 1 of the present embodiment has an operation similar to that described above, many changes or modifications to the circuit configuration thereof are possible without departing from the gist of the invention.

Third Embodiment

Figure 17:
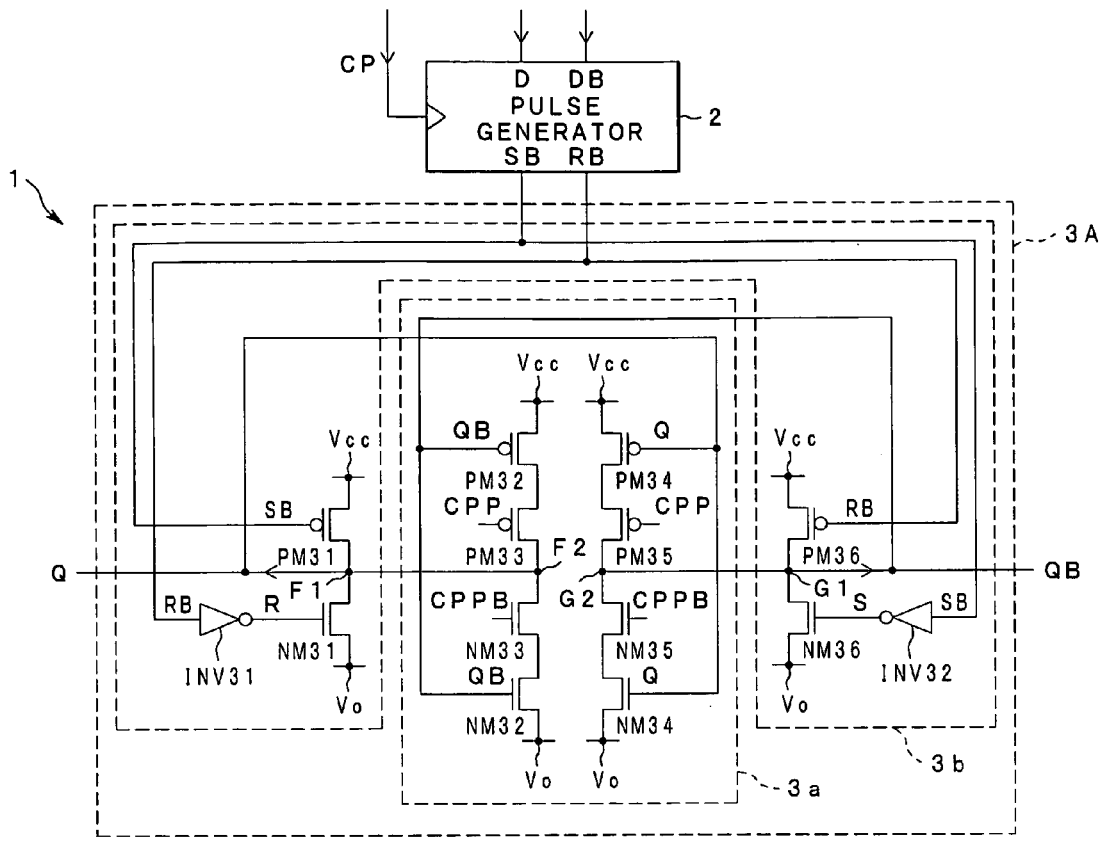
FIG. 17 is a view showing an example of a specific circuit configuration of a latch circuit included in a semiconductor integrated circuit device according to a third embodiment.
Figure 18:
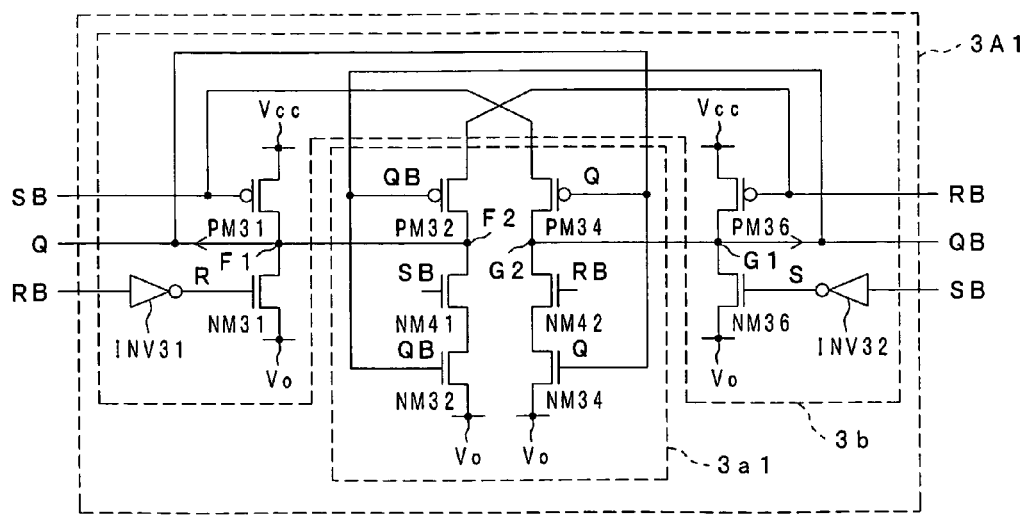
FIG. 18 is a view showing a circuit configuration as a variation of the latch circuit of FIG. 17.

FIGS. 17 and 18 relate to a third embodiment of the present invention. As for parts having a configuration similar to that of the first embodiment and second embodiment, a detailed explanation thereof is omitted. Also, the same reference numerals are applied to constituent elements corresponding to the first embodiment and second embodiment, and an explanation thereof is omitted.

The semiconductor integrated circuit device 1 of the present embodiment has a pulse generator 2 and a latch circuit 3A. Also, the pulse generator 2 and latch circuit 3A are connected similarly to the connection status shown in FIG. 1, and the semiconductor integrated circuit device 1 operates according to the truth value as shown in FIG. 2.

The semiconductor integrated circuit device 1 of the present embodiment has a circuit configuration substantially similar to one shown in FIG. 10, and has a pulsed clock generation circuit (not shown) outputting signal CPP and signal CPPB obtained by inverting signal CPP. Further, in an input end of the latch circuit 3A, there are arranged a node (hereinafter referred to as a CPP input terminal) for receiving signal CPP and a node (hereinafter referred to as a CPPB input terminal) for receiving signal CPPB.

FIG. 17 is a view showing an example of a specific circuit configuration of a latch circuit included in the semiconductor integrated circuit device according to present embodiment. Signal SB is supplied to an SB input terminal connected to a gate of a PMOS transistor PM31 and an input terminal of an inverter INV32. Signal RB is supplied to an RB input terminal connected to an input terminal of an inverter INV31 and a gate of a PMOS transistor PM36.

In the PMOS transistor PM31, according to signal SB supplied to the gate thereof, the source/drain path between a source connected to a voltage supply terminal Vcc and a drain connected to a drain of an NMOS transistor NM31 via a node F1 is turned on or turned off. Accordingly, when the PMOS transistor PM31 is turned on according to signal SB, the node F1 can be changed to level H.

The inverter INV31 outputs, according to signal RB supplied from the input end, signal R to a gate of an NMOS transistor NM31.

In the NMOS transistor NM31, according to signal R supplied to the gate thereof, the source/drain path between a source connected to a reference voltage terminal Vo and the drain connected to the node F1 is turned on or turned off. Accordingly, when the NMOS transistor NM31 is turned on according to signal R, the node F1 can be changed to level L.

The PMOS transistor PM31 and NMOS transistor NM31 are cascaded between the voltage supply terminal Vcc and reference voltage terminal Vo.

In the PMOS transistor PM36, according to signal RB supplied to a gate thereof, the source/drain path between a source connected to a voltage supply terminal Vcc and a drain connected to a node G1 is turned on or turned off. Accordingly, when the PMOS transistor PM36 is turned on according to signal RB, the node G1 can be changed to level H.

The inverter INV32 outputs, according to signal SB supplied from the input end, signal S to a gate of an NMOS transistor NM36.

In the NMOS transistor NM36, according to signal S supplied to the gate, the source/drain path between a source connected to a reference voltage terminal Vo and a drain connected to the node G1 is turned on or turned off. Accordingly, when the NMOS transistor NM36 is turned on according to signal S, the node G1 can be changed to level L.

The PMOS transistor PM36 and NMOS transistor NM36 are cascaded between the voltage supply terminal Vcc and reference voltage terminal Vo.

A status transition circuit 3b is constituted of the NMOS transistors NM31 and NM36, the PMOS transistors PM31 and PM36 and the inverters INV31 and INV32. The above described configuration of these parts allows the logical status of signal Q and signal QB to transit.

Signal Q dependent on a voltage of the node F1 is outputted to the data output side of the semiconductor integrated circuit device 1. The node F1 is also connected to a node F2 within a status holding circuit 3a. The node F2 acting as an output node is connected to respective gates of a PMOS transistor PM34 and an NMOS transistor NM34. Signal Q is also supplied to respective gates of the PMOS transistor PM34 and NMOS transistor NM34.

In the PMOS transistor PM34, according to signal Q supplied to a gate thereof, the source/drain path between a source connected to a voltage supply terminal Vcc and a drain connected to a source of a PMOS transistor PM35 is turned on or turned off.

In the NMOS transistor NM34, according to signal Q supplied to a gate thereof, the source/drain path between a source connected to a reference voltage terminal Vo and a drain connected to a source of an NMOS transistor NM35 is turned on or turned off.

Signal QB dependent on a voltage of the node G1 is outputted to the data output side of the semiconductor integrated circuit device 1. The node G1 is also connected to a node G2 within the status holding circuit 3*a*. The node G2 acting as an output node is connected to respective gates of a PMOS transistor PM32 and an NMOS transistor NM32. Signal QB is also supplied to respective gates of the PMOS transistor PM32 and NMOS transistor NM32.

In the PMOS transistor PM32, according to signal QB supplied to a gate thereof, the source/drain path between a source connected to a voltage supply terminal Vcc and a drain connected to a source of a PMOS transistor PM33 is turned on or turned off.

In the NMOS transistor NM32, according to signal QB supplied to a gate thereof, the source/drain path between a source connected to a reference voltage terminal Vo and a drain connected to a source of an NMOS transistor NM33 is turned on or turned off.

The PMOS transistors PM33 and PM35 shown in FIG. 17 operate when signal CPP is supplied to respective gates. The NMOS transistors NM33 and NM35 operate when signal CPPB is supplied to respective gates. These PMOS transistors PM33 and PM35 and NMOS transistors NM33 and NM35 constitute part of a switching unit.

The operation performed in the pulsed clock generation circuit included in the semiconductor integrated circuit device 1 of the present embodiment when signal CPP is generated, is substantially similar to that described in the second embodiment. Signal CPPB is obtained by inverting signal CPP by an inverter not shown.

In the PMOS transistor PM33, according to signal CPP supplied to the gate, the source/drain path between the source connected to the drain of the PMOS transistor PM32 and a drain connected to the node F2 is turned on or turned off. In the PMOS transistor PM35, according to signal CPP supplied to the gate, the source/drain path between the source connected to the drain of the PMOS transistor PM34 and the drain connected to the node G2 is turned on or turned off.

In the NMOS transistor NM33, according to signal CPPB supplied to the gate, the source/drain path between the source connected to the drain of the NMOS transistor NM32 and the drain connected to the node F2 is turned on or turned of f. In the NMOS transistor NM35, according to signal CPPB supplied to the gate, the source/drain path between the source connected to the drain of the NMOS transistor NM34 and the drain connected to the node G2 is turned on or turned off.

The PMOS transistors PM32 and PM33 and NMOS transistors NM33 and NM32 are cascaded between the voltage supply terminal Vcc and reference voltage terminal Vo. The PMOS transistors PM32 and PM33 and NMOS transistors NM33 and NM32 constitute part of the status holding circuit 3*a* holding a voltage of the node F2 and thereby holding the status of signal Q acting as an output signal.

The PMOS transistors PM34 and PM35 and NMOS transistors NM35 and NM34 are cascaded between the voltage supply terminal Vcc and reference voltage terminal Vo. The PMOS transistors PM34 and PM35 and NMOS transistors NM35 and NM34 constitute part of the status holding circuit 3*a* holding a voltage of the node G2 and thereby holding the status of signal QB acting as an output signal.

According to the configuration described above, the PMOS transistor PM34 is turned off when signal Q of level H is received, and turned on when signal Q of level L is received. The NMOS transistor NM34 is turned off when signal Q of level L is received, and turned on when signal Q of level H is received. Consequently, when both the PMOS transistor PM35 and NMOS transistor NM35 are in an ON state, signal Q of level H is converted to level L and appears at the node G2, and signal Q of level L is converted to level H and appears at the node G2. More specifically, the PMOS transistor PM34 and NMOS transistor NM34 constitute an inverter circuit which receives signal Q and outputs signal QB. Similarly, the PMOS transistor PM32 and NMOS transistor NM32 constitute an inverter circuit which receives signal QB and outputs signal Q. These two inverter circuits are connected so that each output acts as each input, and have a function of holding a voltage of the node F2 and node G2.

Next, the operation of the semiconductor integrated circuit device 1 according to the present embodiment, for example, when the latch circuit 3A as shown in FIG. 17 is employed as a specific circuit configuration, will now be described.

When signal D and signal DB is received from the data input side of the semiconductor integrated circuit device 1, the pulse generator 2 generates signal SB and signal RB dependent on signal D and signal DB at a timing when signal CP changes to level H, and outputs them to the latch circuit 3A. Also, signal CP is supplied to the pulsed clock generation circuit (not shown) included in the semiconductor integrated circuit device 1 to thereby be shortened in pulse width, and outputted as signal CPP and signal CPPB having a narrow width.

Supplied to the PMOS transistors PM31 and PM36 are a signal obtained by inverting signal SB and a signal obtained by inverting signal RB, respectively. Also, supplied to the NMOS transistors NM31 and NM36 are a signal obtained by inverting signal RB and a signal obtained by inverting signal SB, respectively.

In a status where signal SB is at level L and at the same time, signal RB is at level H, the PMOS transistor PM31 and NMOS transistor NM36 are turned on, and the NMOS transistor NM31 and PMOS transistor PM36 are turned off. At this time, the node F1 changes to level H, and the node G1 changes to level L.

Meanwhile, in a status where signal SB is at level H and at the same time, signal RB is at level L, the PMOS transistor PM31 and NMOS transistor NM36 are turned off, and the NMOS transistor NM31 and PMOS transistor PM36 are turned on. At this time, the node F1 changes to level L, and the node G1 changes to level H.

In a period where signal CPP is at level L (in a period where signal CPPB is at level H), as described above, both signal SB and signal RB are at level H. In this case, the PMOS transistors PM31 and PM36 and the NMOS transistors NM31 and NM36 are all in an OFF state, and thus do not affect the voltage of the node F1 and node G1. More specifically, in a period where signal CPP is at level L, the voltage of the node F1 and node G1 is held by the status holding circuit 3*a*.

Also, in a period where signal CPP is at level L, the PMOS transistors PM33 and PM35 and the NMOS transistors NM33 and NM35 are all in an ON state. Accordingly, in the status holding circuit 3*a*, there are constituted: an inverter circuit, composed of the PMOS transistor PM34 and NMOS transistor NM34, receiving signal Q and outputting signal QB; and an inverter circuit, composed of the PMOS transistor PM32 and NMOS transistor NM32, receiving signal QB and outputting signal Q. These two inverter circuits hold the voltage of the node F2 and node G2 connected respectively to the node F1 and node G1.

In a capturing period where signal CPP is at level H (in a period where signal CPPB is at level L), the PMOS transistors PM33 and PM35 and the NMOS transistors NM33 and NM35 are all in an OFF state. Accordingly, the PMOS transistors PM32 and PM34 and the NMOS transistors NM32 and NM34 constituting two inverter circuits connected to each other in the status holding circuit 3*a*, are electrically separated from the node F2 and node G2. It is assumed that, in such status, the voltages of the node F1 and node G1 vary according to logical level of signal SB and signal RB. In this case, the inverter circuit constituted in the status holding circuit 3a is not electrically connected to the node F2 and node G2. Accordingly, the change of the node F1 and node G1 from level H to level L or from level L to level H is sharply made without being affected by the PMOS transistors PM32 and PM34 and the NMOS transistors NM32 and NM34.

Differently from the status holding circuit 3a of the present embodiment, when operated, the status holding circuit proposed in Document 1 requires not signal CPP and signal CPPB but four signals, i.e., signal RB, signal SB, signal R and signal S. When supplied to the above status holding circuit, the four signals are supplied with respective delays thereof increased by gate capacitance in the status holding circuit. Therefore, when a latch circuit having the status holding circuit proposed in Document 1 is employed as the latch circuit of the semiconductor integrated circuit device 1, the operating speed of the whole semiconductor integrated circuit device is reduced. However, when the latch circuit 3A having the status holding circuit 3a is employed as the latch circuit of the semiconductor integrated circuit device 1, the status holding circuit 3a is operated by signal CPP and signal CPPB, so respective delays of signal RB, signal SB, signal R and signal S by the aforementioned gate capacitance are reduced, thus making it possible to increase the operating speed of the whole semiconductor integrated circuit device 1.

The latch circuit 3A of the present embodiment may be constituted as a latch circuit 3A1 shown in FIG. 18 in which the status holding circuit 3a is replaced with a status holding circuit 3a1, whereby the operation can be performed without using signal CPP and signal CPPB. FIG. 18 is a view showing a circuit configuration as a variation of the latch circuit of FIG. 17.

The status holding circuit 3a1 of the latch circuit 3A1 has a configuration in which the PMOS transistors PM33 and PM35 are removed from the status holding circuit 3a, and a PMOS transistor PM32 whose drain is connected to a node F2 and a PMOS transistor PM34 whose drain is connected to a node G2 are provided. In the status holding circuit 3a1, signal RB is supplied to a source of the PMOS transistor PM32, and signal SB is supplied to a source of the PMOS transistor PM34.

Also, the status holding circuit 3a1 has a configuration in which an NMOS transistor NM41 is provided instead of the NMOS transistor NM33 and an NMOS transistor NM42 is provided instead of the NMOS transistor NM35. The NMOS transistors NM41 and NM42 constitute part of a switching unit.

In the NMOS transistor NM41, according to signal SB supplied to a gate thereof, the source/drain path between a source connected to a drain of an NMOS transistor NM32 and a drain connected to the node F2 is turned on or turned off.

In the NMOS transistor NM42, according to signal RB supplied to a gate thereof, the source/drain path between a source connected to a drain of an NMOS transistor NM34 and a drain connected to the node G2 is turned on or turned off.

The status holding circuit 3a1 has a function of holding a voltage of the node F2 and node G2 according to signal SB and signal RB.

Next, the operation of the semiconductor integrated circuit device 1 when the latch circuit 3A1 as shown in FIG. 18 is employed, will now be described. By way of example, a case where the node F1 is at level L and at the same time, the node G1 is at level H, will be studied. At this time, when signal SB of level H and signal RB of level H are supplied to the latch circuit 3A1, the PMOS transistors PM31 and PM36 and the NMOS transistors NM31 and NM36 are each turned off; thus, the status of the node F1 and node G1 does not transit. Also, in the aforementioned status, both the NMOS transistors NM41 and NM42 are turned on, and further the sources of the PMOS transistors PM32 and PM34 each change to level H. Accordingly, the status holding circuit 3a1 has a circuit configuration equivalent to two inverter circuits constituted of a first inverter including the PMOS transistor PM32 and NMOS transistor NM32, and a second inverter including the PMOS transistor PM34 and NMOS transistor NM34. The first inverter circuit inverts signal QB supplied and outputs it to the node F2; the second inverter circuit inverts signal Q supplied and outputs it to the node G2. When the status holding circuit 3a1 has such configuration, the status of the node F1 and node G1 is held.

Also, by way of example, a case where, in a status where the node F1 is at level L and the node G1 is at level H, signal SB of level L and signal RB of level H are supplied to the latch circuit 3A1, will be considered. At this time, signal Q is at level L, so the PMOS transistor PM34 is in an ON state. Also, signal SB is at level L, so the source of the PMOS transistor PM34 is at level L. Accordingly, discharge via the PMOS transistor PM34 occurs, whereby the node G2 transits from level H to level L. At this time, since the NMOS transistors NM34 and NM41 and PMOS transistor PM32 are all in an OFF state, the other paths in the status holding circuit 3a1 are in an OFF state.

Further, at this time, the PMOS transistor PM31 is turned on by signal SB of level L, so the node F1 transits to level H. Also, at this time, the NMOS transistor NM36 is turned on by signal SB of level H, so the node G1 transits to level L. In the latch circuit 3A1, signal Q and signal QB transit as described above, whereby signal Q changes to level H and signal QB changes to level L.

As described above, differently from the status holding circuit proposed by Document 1, when operated, the status holding circuit 3a in the latch circuit 3A used in the semiconductor integrated circuit device 1 of the present embodiment does not require any of signal RB, signal SB, signal R and signal S. Therefore, in the semiconductor integrated circuit device 1, the latch circuit 3A operates with a relatively sharp rising edge or down edge, thus allowing a faster speed operation, as compared to conventional art.

Also, differently from the status holding circuit proposed by Document 1, when operated, the status holding circuit 3a1 in the latch circuit 3A1 used in the semiconductor integrated circuit device 1 of the present embodiment does not require signal R and signal S. Therefore, in the semiconductor integrated circuit device 1, the latch circuit 3A1 operates with a relatively sharp rising edge or down edge, thus allowing a faster speed operation, as compared to conventional art.

Also, in the semiconductor integrated circuit device operating without using signal CPP being a clock pulse and signal CPPB obtained by inverting signal CPP, the status holding circuit 3a1 can operate without generating these signals anew, and thus can contribute to reduction in power consumption in the whole semiconductor integrated circuit device.

It is noted that the circuit configuration of the latch circuit included in the semiconductor integrated circuit device 1 of the present embodiment shown in FIGS. 17 and 18 is an exemplary specific circuit configuration, and the present invention is not limited only to the circuit configuration according to the present embodiment described above. Therefore, if the latch circuit included in the semiconductor integrated circuit device 1 of the present embodiment has an operation similar to that described above, various changes or modifications to the circuit configuration thereof are possible without departing from the gist of the invention.

Table 1 described below is a table for explaining advantageous effects of each embodiment described above, and shows measurement results of delay time taken from when clock signal CP rises to when signal Q is actually outputted. In Table 1, there is shown a comparison of delay time between the flip-flop SAFF described in Non-Patent Document 1 and the flip-flop of the embodiment of FIG. 4. In the example of Table 1, speeding-up of about 18% is achieved.

TABLE 1

|  | Delay [psec] |
|---|---|
| SAFF in Non-Patent Document 1 | 67 |
| Flip-flop of FIG. 4 | 55 |

Fourth Embodiment

Figure 19:
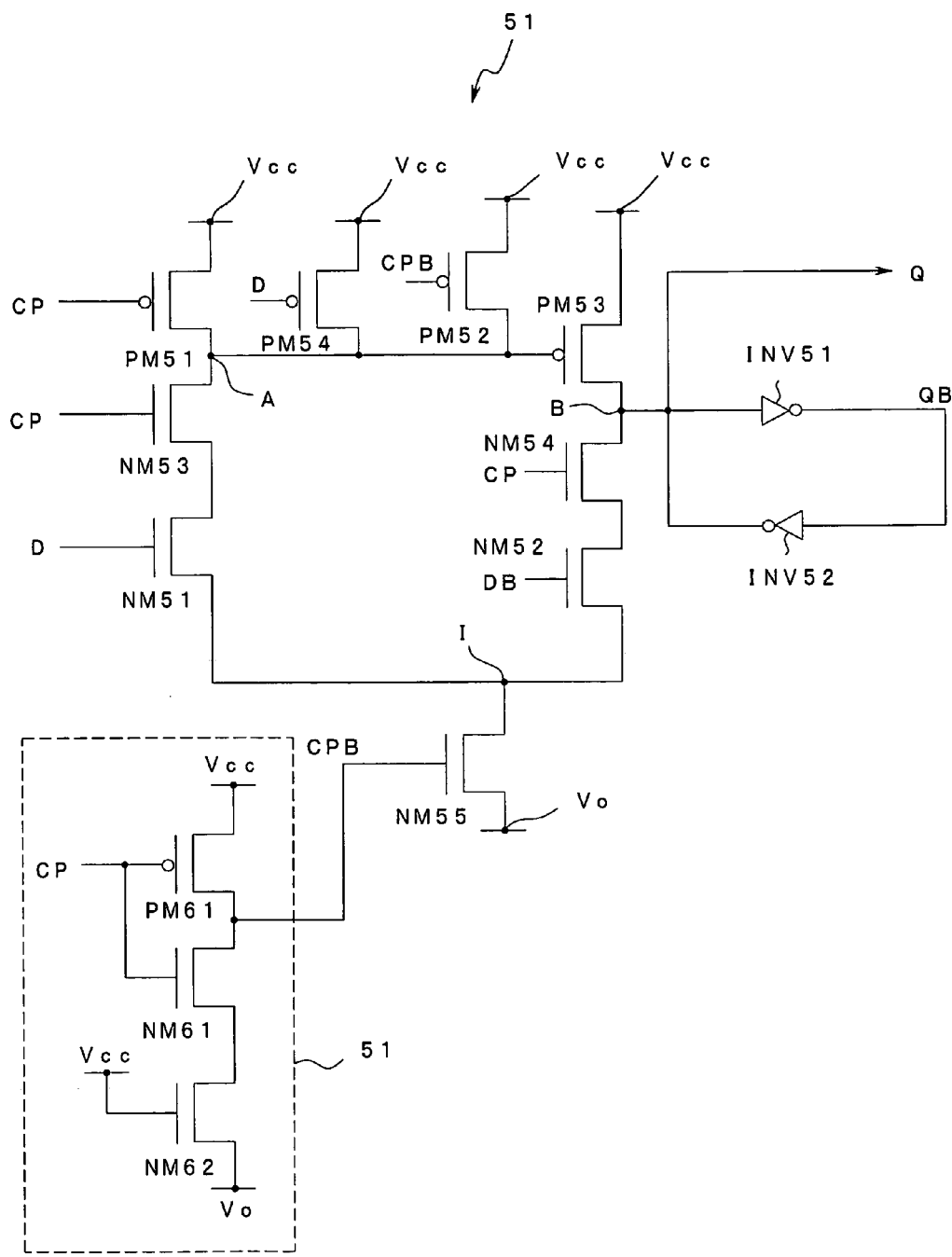
FIG. 19 is a circuit diagram showing a semiconductor integrated circuit device according to a fourth embodiment of the present invention.

FIG. 19 is a circuit diagram showing a semiconductor integrated circuit device according to a fourth embodiment of the present invention. FIG. 19 shows an example in which a flip-flop having a single-phase configuration is employed.

In a flip-flop 51 of FIG. 19, signal D and signal DB are supplied to gates of differential NMOS transistors NM51 and NM52, respectively. The flip-flop 51 serves to allow the level of a pre-charge node A to internally transit according to signals D and allow the level of a status holding node (output node) B to transit according to a level of the pre-charge node A.

The pre-charge node A is connected to a power source terminal Vcc via a source/drain path of the PMOS transistor PM51, a source/drain path of the PMOS transistor PM52 and a source/drain path of a PMOS transistor PM54. Signal CP is supplied to the gate of the PMOS transistor PM51, and signal CPB, to the gate of the PMOS transistor PM52.

The pre-charge node A is connected to a discharge path. Connected in series to this discharge path are a source/drain path of an NMOS transistor NM53 and a source/drain path of an NMOS transistor NM51.

Also, a source/drain path of the PMOS transistor PM53 is connected onto a charge path between the power source terminal Vcc and the status holding node B. A gate of the transistor PM53 is connected to the pre-charge node A.

The status holding node B is connected to a discharge path. Connected in series to this discharge path are a source/drain path of an NMOS transistor NM54 and a source/drain path of an NMOS transistor NM52. The sources of the transistors NM51 and NM52 are connected at a common point. This common point is connected to a reference voltage terminal Vo via a source/drain path of an NMOS transistor NM55.

The status holding node B is connected to an input end of an inverter INV51. An output end of the inverter INV51 is connected to an input end of an inverter INV52. An output end of the inverter INV52 is connected to the input end of the inverter INV51. These inverters INV51 and INV52 constitute a status holding circuit.

The transistors NM51, NM53, NM55, PM51, PM52 and PM54 constitute a pulse generator. The transistors NM52, NM54 and PM53, and the inverters INV51 and INV52 constitute a latch circuit.

Signal CPB is supplied from a delay/inverting circuit 51 described below to a gate of the transistor NM55. In a pre-charge period, signal CP is at level L, and the transistor PM51 is in an ON state. Accordingly, the pre-charge node A is set to level H. In the pre-charge period, signal CPB is at level H.

When the pre-charge period ends and signal CP changes to level H, signal CPB changes from level H to level L after the lapse of a delay time of the delay/inverting circuit 51 described below. In a transition period, both signal CP and signal CPB are at level H. In this transition period, when it is assumed that the transistors PM51 and PM52 charging the pre-charge node A are in an OFF state and the transistor PM54 is also in an OFF state, then the level of the pre-charge node A is determined by the status of the discharge path connected to the pre-charge node A.

In the transition period, the transistors NM53 and NM55 are in an ON state. When signal D is at level H (signal DB is at level L), the transistor NM51 is turned on, and the electric charge of the pre-charge node A is discharged via the discharge path, and the pre-charge node A internally transits to level L. Meanwhile, when signal D is at level L, the transistor NM51 is in an OFF state, and the pre-charge node A holds level H.

When the pre-charge node A is in at level L, the transistor PM53 is turned on, and the status holding node B is charged. This is a case in which signal DB is at level L, and the discharge path connected to the status holding node B is in a cut-off state, and the status holding node B transits to level H.

Meanwhile, when the pre-charge node A is at level H, the transistor PM53 is turned off. In the transition period, when signal DB is at level H, the discharge path changes to an ON state, and the status holding node B transits to level L.

In this manner, in the transition period, the status holding node B is changed to level H by signal D of level H; the status holding node B is changed to level L by signal D of level L. The level of the status holding node B is outputted as Q output.

In a period excluding the transition period, the pre-charge node A is set to level H. Consequently, the transistor PM53 is in an OFF state, and the discharge path connected to the status holding node B is also in an OFF state. The inverter INV51 and inverter INV52 receive each other's output and constitute the status holding circuit. More specifically, in a period excluding a transition period, the status of the status holding node B is held by the inverter INV51 and inverter INV52.

In this manner, in a period prior to the transition period where both signal CP and signal CPB change to level H, there is set a pre-charge period in which signal CP is changed to level L to pre-charge the node A. In this pre-charge period, as shown in FIG. 7, signal CPB is at level H. Consequently, in the pre-charge period, the NMOS transistor NM55 is in an ON state, and thus an electric charge at a node I is discharged. Accordingly, at the start time of the transition period, no electric charge is accumulated in parasitic capacitance at the node I, and thus immediately after the start time of the transition period, the electric charge at the node A can be flowed to the node I at a high speed, whereby discharge of the node A can be performed at a high speed. Accordingly, after the start time of the transition period, the node B can be charged in a relatively short time.

More specifically, according to the present embodiment, also, transition can be sped up, whereby flip-flop operation can be sped up.

Also, according to the present embodiment, a delay/inverting circuit 51 different from that of FIG. 5 is employed. The delay/inverting circuit 51 has a PMOS transistor PM61 and NMOS transistors NM61 and NM62. Between a voltage supply terminal Vcc and a reference voltage terminal Vo, there are connected in series a source/drain path of the PMOS transistor PM61, a source/drain path of the transistor NM61 and a source/drain path of the transistor NM62.

Signal CP is supplied to gates of the transistors PM61 and NM61. The power source voltage Vcc is applied to a gate of the transistor NM62. A connection point between the transistors PM61 and NM61 acts as an output end of the delay/inverting circuit 51, and the output end is connected to the gate of the NMOS transistor NM55.

In the delay/inverting circuit 51 configured in this manner, when signal CP is at level L, the transistor PM61 is turned on and the transistor NM61 is in an OFF state. The transistor NM62 is in an ON state at all times, and the connection point (output end) between the transistors PM61 and NM61 changes to level H.

When signal CP changes to level H, the transistor PM61 is turned off and the transistor NM61 is turned on, and the output end transits to level L after a predetermined time period according to a time constant determined by parasitic capacitance and resistance by the transistors NM61 and NM62. In this manner, after signal CP changes from level L to level H, after a predetermined delay time, the output end changes to level L. More specifically, signal CPB being a signal obtained by delaying/inverting signal CP appears at the output end.

According to such configuration, the number of charge/discharge stages (the number of inverters) is reduced, thus allowing reduction in power consumption. Also, there is an advantage in that the number of transistors required is reduced and thus the required space is small.

Also, according to a time constant dependent on resistance of the transistor NM62, signal CPB changes from level H to level L. More specifically, signal CPB falls slowly according to the time constant, and even after the transition period ends, signal CPB does not fall completely. That is, in the transistor NM55, some amount of time current flows even after the transition period ends.

Meanwhile, when the transition period is long, data may change in that transition period. Therefore, the transition period must be set to a relatively short time. However, when the transition period is short, there is a risk that discharge of the pre-charge node is not thoroughly performed.

However, when the delay/inverting circuit 51 of FIG. 19 is employed, even after the transition period ends, the transistor NM55 continues the discharge for sometime. Thus, the pre-charge node can be surely discharged.

In this manner, when the delay/inverting circuit 51 of FIG. 19 is employed, the pre-charge node can be surely discharged in the transition period, thereby allowing improvement in operational stability.

Further, in the circuit of FIG. 19, as described above, the PMOS transistor PM54 is added. Signal D is supplied to a gate of the transistor PM54. The pre-charge node A is charged by the transistor PM51 in a period where signal CP is at level L, and charged by the transistor PM52 in a period where signal CPB is at level L. In the transition period, these transistors PM51 and PM52 need to be turned off, thereby keeping the pre-charge node A in a dischargeable state.

However, when signal D is at level L, the pre-charge node A does not need to be discharged. Thus, in the example of FIG. 19, even in the transition period, when signal D is at level L, the pre-charge node A is charged by the transistor PM54.

Accordingly, the pre-charge node A can be surely kept at level H, and a circuit having high tolerance against noise can be obtained.

Figure 20:
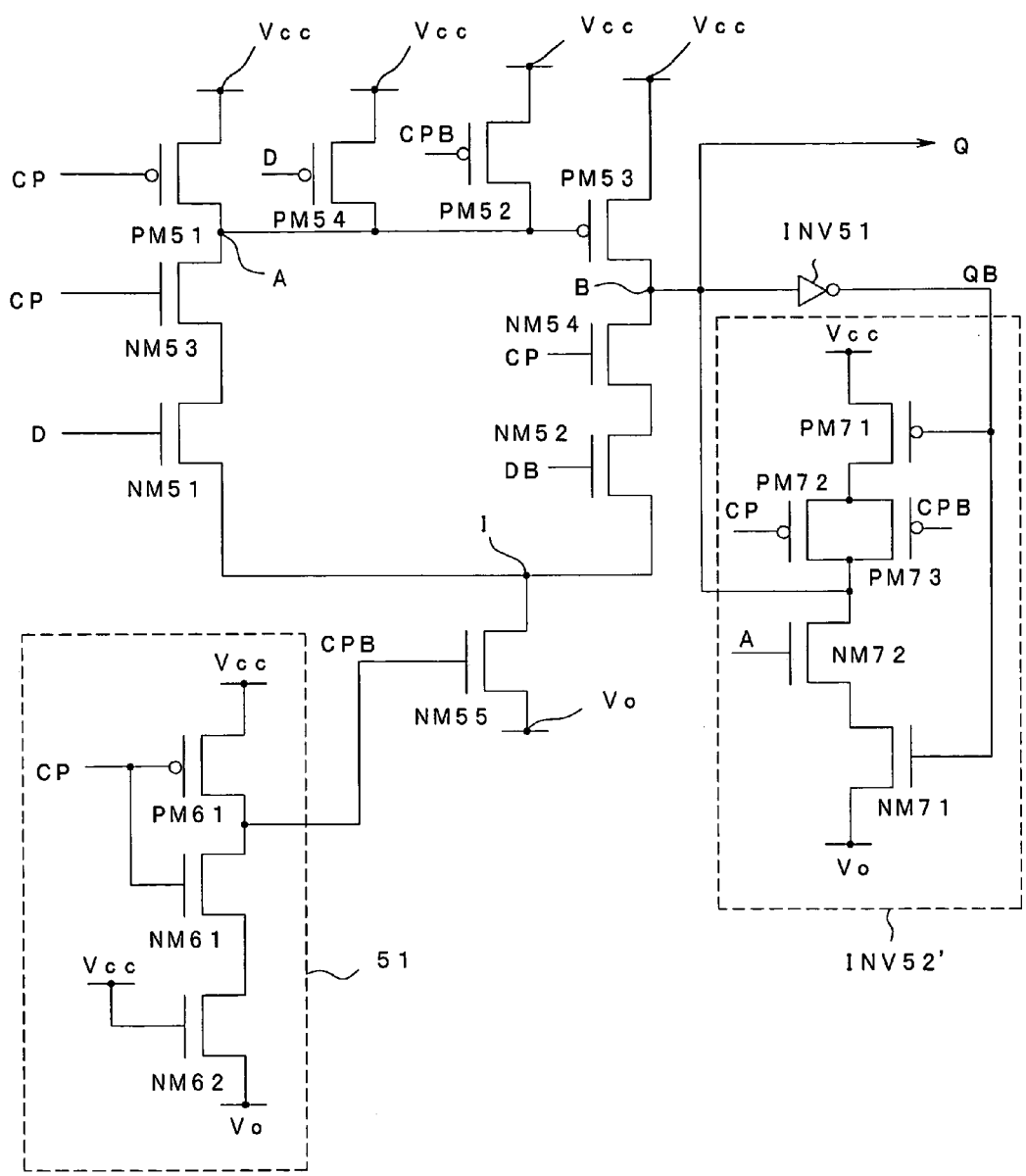
FIG. 20 is a circuit diagram showing a variation of the semiconductor integrated circuit device of FIG. 19.

FIG. 20 is a circuit diagram showing a variation of the semiconductor integrated circuit device of FIG. 19. In FIG. 20, the same reference numerals are applied to constituent elements corresponding to FIG. 19, and an explanation thereof is omitted.

The difference of the circuit of FIG. 20 from that of FIG. 19 lies in that an inverter INV52' is employed as the inverter INV52 of FIG. 18.

The inverter INV52' is constituted of PMOS transistors PM71 to PM73 and NMOS transistors NM71 and NM72. Between a voltage supply terminal Vcc and a reference voltage terminal Vo, there are disposed the transistors PM71 and NM71 constituting an inverter. An output of an inverter INV51 is supplied to gates of the transistors PM71 and NM71.

Between the transistors PM71 and NM71, there are disposed transistors PM72, PM73 and NM72 for controlling an output status holding unit. Source/drain paths of the transistors PM72 and PM73 are connected in parallel. One end of the source/drain paths connected in parallel is connected to the power source terminal Vcc via a source/drain path of the transistor PM71; the other end is connected to the reference voltage terminal Vo via a source/drain path of the transistor NM72 and a source/drain path of the transistor NM71.

A connection point between the source/drain paths of the transistors PM72 and PM73 and the source/drain path of the transistor NM72 is connected to a QB output terminal and an input end of the inverter INV51.

The transistors PM71 and NM71 constitute an inverter which receives signal QB being an output of the inverter INV51 and outputs signal Q to a Q output terminal. More specifically, the transistors PM71 and NM71 are two inverters which receive each other's output with the inverter INV51. These inverters constitute the output status holding unit which holds the status of the Q output terminal.

Meanwhile, the transistors PM72, PM73 and NM72 constitute an output status holding control unit controlling the output status holding unit. To a gate of the transistor NM72, there is supplied control signal A which changes to level L in a transition period and changes to level H in the other period. Accordingly, the transistor NM72 is turned on in a period excluding a transition period and turned off in a transition period.

Also, in a period where signal CP is at level L, the transistor PM72 is turned on; in a period where signal CPB is at level L, the transistor PM73 is turned on. Consequently, the transistors PM72 and PM73 are also turned on only in a period excluding a transition period.

Consequently, in a period excluding a transition period, a status holding operation is performed by the output status holding unit constituted of the transistors PM71 and NM71 and the inverter INV51; in a transition period, the operation of the output status holding unit stops and thus the status of the QB output terminal is not held.

When the output status holding control unit is provided, the operation of the output status holding unit can be terminated in a transition period, whereby the transition of the QB output terminal can be made easier and operation stability can be improved.

Fifth Embodiment

Figure 21:
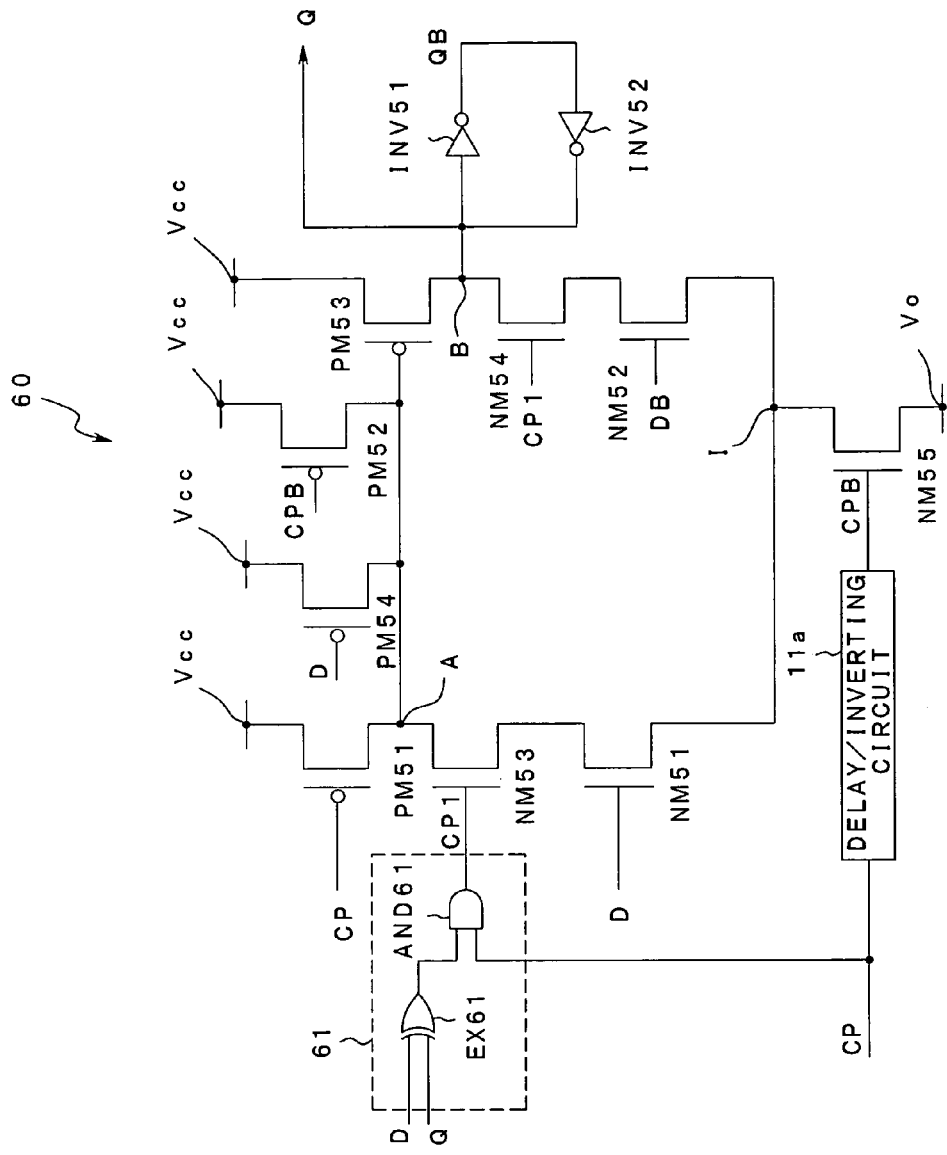
FIG. 21 is a circuit diagram showing a semiconductor integrated device according to a fourth embodiment of the present invention.

FIG. 21 is a circuit diagram showing a semiconductor integrated circuit device according to a fifth embodiment of the present invention. FIG. 21 shows a case where the present invention is applied to a flip-flop 61 which suppresses redundant internal transition and thereby achieves low power consumption. In FIG. 21, the same reference characters are applied to constituent components corresponding to FIGS. 19 and 5, and an explanation thereof is omitted.

The difference of the present embodiment from the fourth embodiment lies in that a clock control circuit 61 is added. In FIG. 21, a delay/inverting circuit 11a is employed, but the delay/inverting circuit 51 of FIG. 19 may be employed.

The clock control circuit 61 is constituted of an EXCLUSIVE-OR circuit EX61 and an AND logic circuit AND61. Signals D and Q are supplied to the EXCLUSIVE-OR circuit EX61. The EXCLUSIVE-OR circuit EX61 performs a logic operation EXCLUSIVE OR between signals D and Q, and outputs the operation result to the AND logic circuit AND61. Signal CP is also supplied to the AND logic circuit AND61. The AND logic circuit AND61 supplies to the gate of the transistor NM53 the operation AND result between the two inputs.

In the embodiment configured in this manner, when signals D and Q have the same logic, the output of the EXCLUSIVE-OR circuit EX61 is at level L; when signal logic is different between signals D and Q, the output of the EXCLUSIVE-OR circuit EX61 is at level H. When the output of the EXCLUSIVE-OR circuit EX61 is at level H, the AND logic circuit AND61 supplies signal CP to the gate of the transistor NM53; when the output of the EXCLUSIVE-OR circuit EX61 is at level L, the AND logic circuit AND61 supplies level L to the gate of the transistor NM53.

As explained in the above described example of FIG. 8, when signal D having the same logic as that of signal Q, the voltage of the pre-charge node A does not need to be discharged. Thus, according to the present embodiment, in order to prevent unwanted internal transition from occurring, when signals D and QB have the same logic, a signal of level L is supplied to the gate of the transistor NM53. Accordingly, when signals D and QB have the same logic, the transistor NM53 is turned off to cut off the discharge path of the pre-charge node A. Also, when signal logic is different between signals D and Q, signal CP is supplied to the gate of the transistor NM53, similarly to an ordinary case.

Thus, according to the present embodiment, redundant internal transition can be reduced, allowing implementing of low power consumption.

Figure 22:
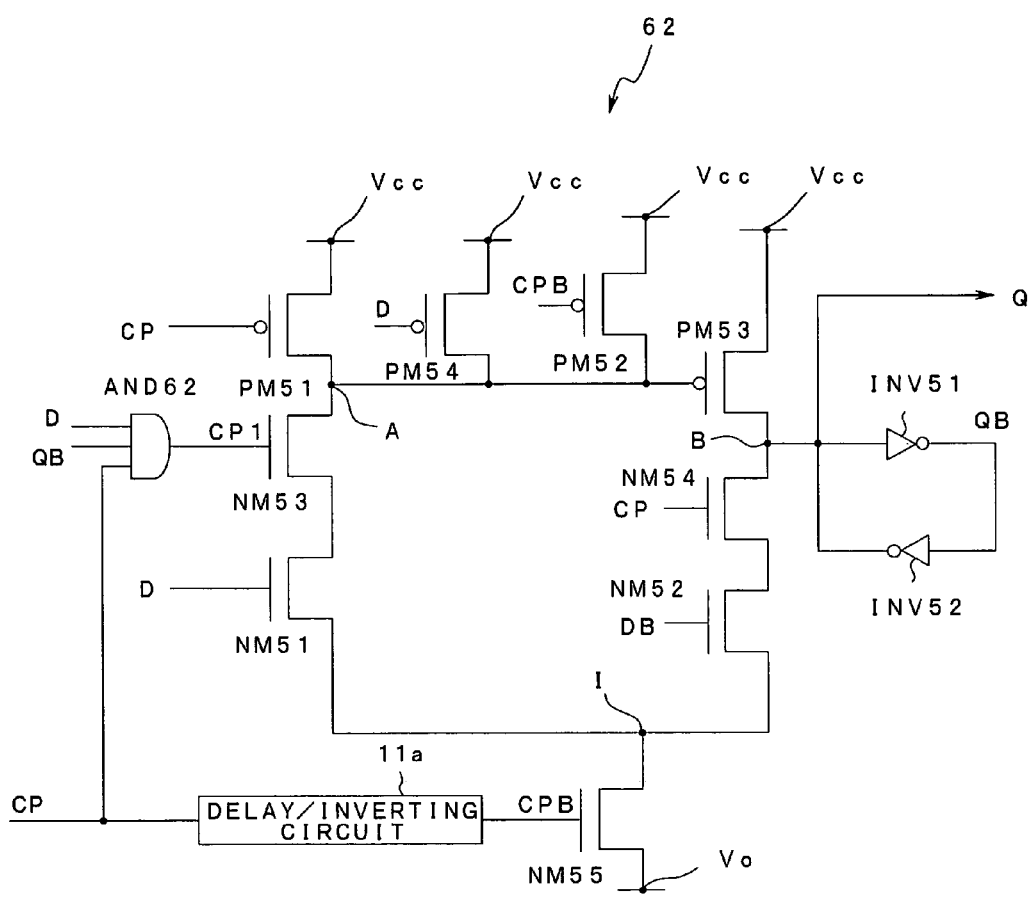
FIG. 22 is a circuit diagram showing a variation of the semiconductor circuit device of FIG. 21.

FIG. 22 is a circuit diagram showing a variation of the semiconductor integrated circuit device of FIG. 21. In FIG. 22, the same reference numerals are applied to constituent elements corresponding to FIG. 21, and an explanation thereof is omitted.

The difference of a flip-flop 62 of FIG. 22 from the flip-flop 60 of FIG. 21 lies in that an AND logic circuit AND62 is employed instead of the AND logic circuit AND61.

Signals D, Q and CP are supplied to the AND logic circuit AND62. The AND logic circuit AND62 performs an AND operation between signals D, Q and CP, and supplies the operation result to a gate of a transistor NM53.

In the variation configured in this manner, when both signals D and QB are at level H, signal CP is supplied to the gate of the transistor NM53; when one or both of signals D and QB is at level L, level L is supplied to the gate of the transistor NM53.

As described in the aforementioned example of FIG. 8, when signal D having logic different from that of signal QB is supplied, the voltage of the pre-charge node A does not need to be discharged. Further, when both signals QB and D are at level L, also, the voltage of the pre-charge node A does not need to be discharged. Thus, in the circuit of FIG. 22, in order to prevent unwanted internal transition from occurring, when one or both of signals D and QB is at level L, a signal of level L is supplied to the gate of the transistor NM53. Accordingly, the transistor NM53 is turned off to cut off the discharge path of the pre-charge node A. Also, when both signals D and QB are at level H, signal CP is supplied to the gate of the transistor NM53, similarly to the ordinary case.

With the above arrangement, in the example of FIG. 22, also, redundant internal transition can be reduced, thus making it possible to achieve low power consumption.

Figure 23:
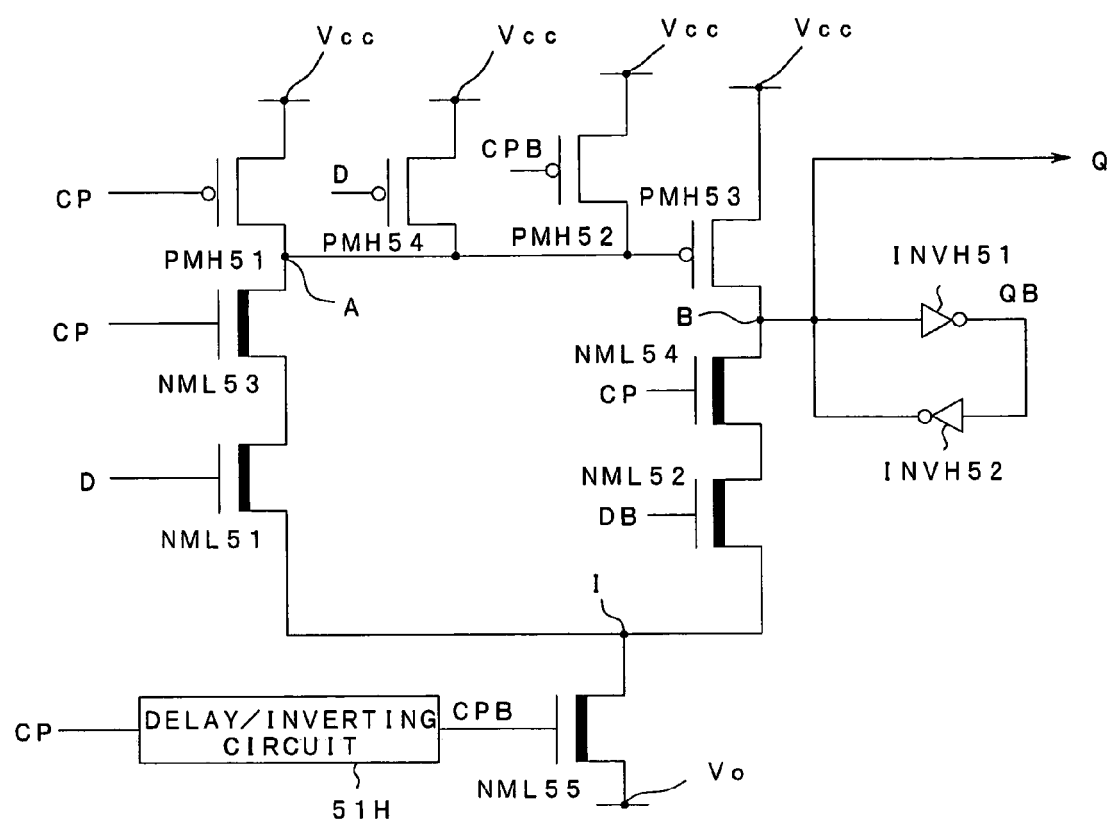
FIG. 23 is a circuit diagram showing another example of the semiconductor integrated circuit device of FIG. 19.

FIG. 23 is a circuit diagram showing another example of the semiconductor integrated circuit device of FIG. 19. In FIG. 23, the same reference characters are applied to constituent components corresponding to FIG. 19, and an explanation thereof is omitted.

The only difference of the circuit of FIG. 23 from the circuit of FIG. 19 lies in that, as each transistor disposed on the discharge paths of the pre-charge node A and the status holding node B, transistors of different Vth from that of the other transistors are employed.

For example, as PMOS transistors PMH51 to PMH54, transistors of higher Vth are employed than that of NMOS transistors NML51 to NML55. Also, transistors used in the inverters INV51 and INV52 and the delay/inverting circuit 51H have higher Vth than that of NMOS transistors NML51 to NML55.

In other words, Vth of the transistors NML51 to NML55 disposed on the discharge path of the pre-charge node A and the discharge path of the status holding node B is set to a relatively low value; Vth of the other transistors is set to a relatively high value. When Vth is set high, leak by transistor is reduced.

Meanwhile, when Vth is set to a lower value in each of the transistors NML51 to NML55 disposed on the discharge path of the pre-charge node A and the discharge path of the status holding node B, discharge can be performed at a higher speed, whereby a higher speed circuit can be obtained. Also, on the discharge path of the pre-charge node A and the discharge path of the status holding node B, there are connected in series the source/drain paths of a plurality of transistors; therefore, leak current is not easy to flow. Consequently, even when the transistors NML51 to NML55 disposed on the discharge path have relatively low vth, leak current can be prevented from occurring.

Table 2 described below is a table for explaining leak reduction effect in the circuit of FIG. 23.

In Table 2, the word "after application" indicates properties for a case where Vth of other transistors is set higher than that of the transistors disposed on the discharge path; the word "before application" indicates properties for a case where vth of other transistors is not set so. The "delay" indicates delay time taken from when signal CP rises to when signal Q is outputted.

TABLE 2

|  | Leak current [nA] | Delay [ps] |
| --- | --- | --- |
| Before application | 6.2 | 45 |
| After application | 1.9 | 48 |

As shown in Table 2 described above, when the circuit of FIG. 23 is employed, leak current can be sufficiently suppressed without hardly varying delay time. Depending on how Vth is set, it is also possible to reduce delay time without hardly varying leak current.

Figure 24:
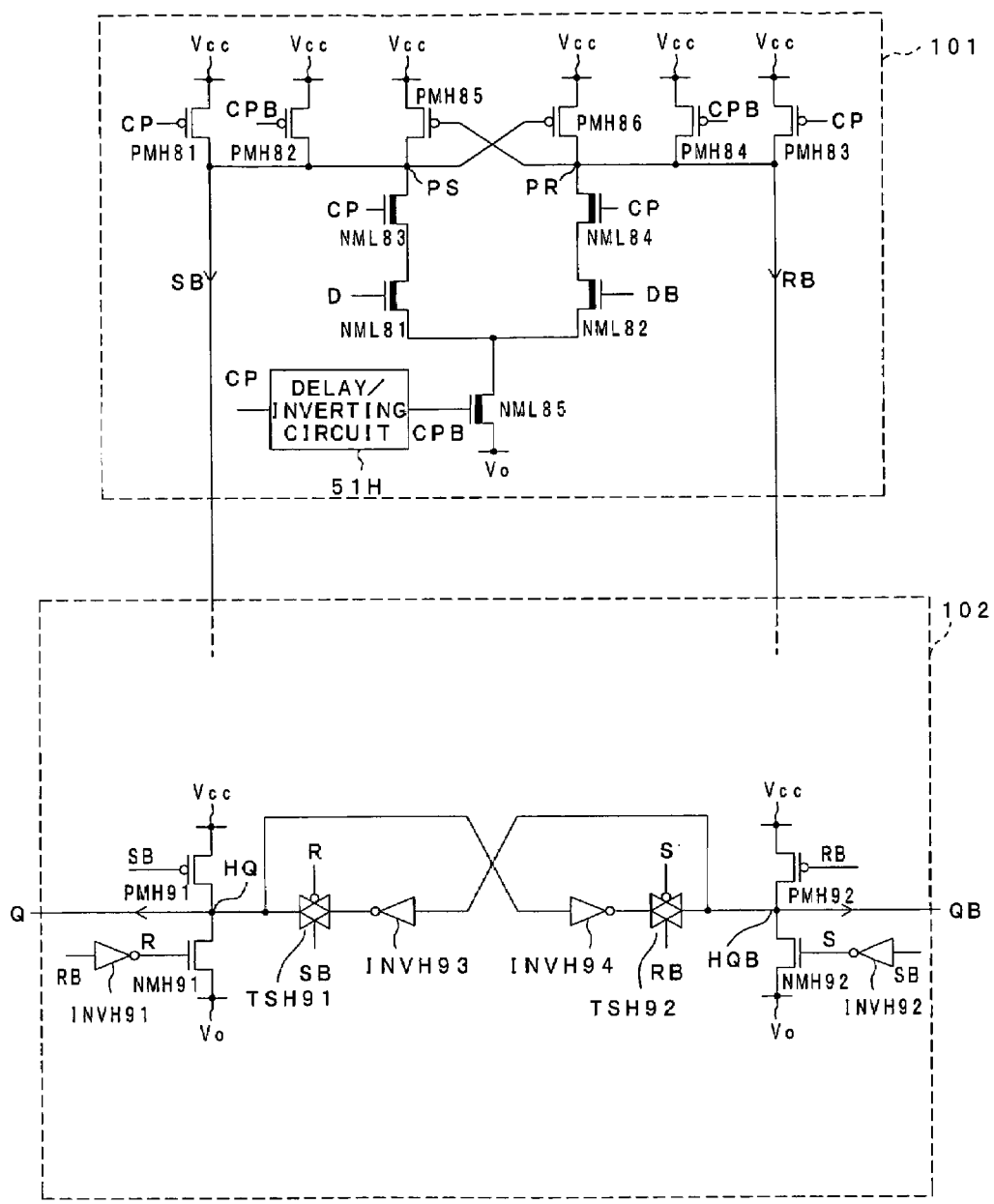
FIG. 24 is a circuit diagram showing another example of the semiconductor integrated circuit device.

FIG. 24 is a circuit diagram showing another example of semiconductor integrated circuit device.

FIG. 24 shows an example in which a flip-flop constituted of a pulse generator unit 101 and an RS latch unit 102 is employed.

<Pulse Generator Unit>

The pulse generator unit 101 of FIG. 24 has a configuration similar to that of the pulse generator 2 of FIG. 4, except in that each transistor has different Vth. More specifically, the configurations of transistors NM81 to NM85 and transistors PM81 to PM86 of the pulse generator unit 101 are similar to those of the transistors NM3, NM4, NM1 and NM5, and the transistors PM1, PM2, PM6, PM5, PM3 and PM4 of the pulse generator 2, respectively. To a gate of the transistor NM85, there is supplied signal CPB generated by a delay/inverting circuit 51H.

<RS Latch Unit>

Signals SB and RB are supplied to the RS latch unit 102. In the RS latch unit 102, there are configured: a first status transition unit constituted of a PMOS transistor PMH91, an NMOS transistor NMH91 and an inverter INVH91; and a second status transition unit constituted of a PMOS transistor PMH92, an NMOS transistor NMH92 and an inverter INVH92. The transistor PMH91 is configured on a first output charge path; the NMOS transistor NMH91 is configured on a first output discharge path. The first status transition unit is constituted by connecting in series a source/drain path of the transistor PMH91 and a source/drain path of the transistor NMH91 between the power source terminal Vcc and reference voltage terminal Vo. The inverter INVH91 generates signal R obtained by inverting signal RB and supplies it to a gate of the transistor NMH91. Signal SB is supplied to the gate of the transistor PMH91. Meanwhile, the second status transition unit is constituted by connecting in series a source/drain path of the transistor PMH92 and a source/drain path of the transistor NMH92 between the power source terminal Vcc and reference voltage terminal Vo. The inverter INVH92 generates signal S obtained by inverting signal SB and supplies it to a gate of the transistor NMH92. Signal RB is supplied to the gate of the transistor PMH92.

A connection point between the transistors PMH91 and NMH91 constitutes a status holding node (Q output terminal) HQ. Also, a connection point between the transistors PMH92 and NMH92 constitutes a status holding node (QB output terminal) HQB.

The status holding node HQ is connected to an output end of a transfer gate TSH91; the status holding node HQB is connected to an output end of a transfer gate TSH92. The status holding node HQB is connected to an input end of an inverter INVH93. Signal QB is inverted by the inverter INVH93 and supplied to an input end of the transfer gate TSH91. Also, the status holding node HQ is connected to an input end of an inverter INVH94. The inverter INVH94 inverts signal Q and supplies it to an input end of the transfer gate TSH92.

In the transfer gate TSH91, signal R is supplied to an inverting control end thereof, and signal SB is supplied to a control end thereof; according to signal R of level L and signal SB of level H, a signal at the input end is outputted from the output end. Also, in the transfer gate TSH92, signal S is supplied to an inverting control end thereof, and signal RB is supplied to a control end thereof; according to signal S of level L and signal RB of level H, a signal at the input end is outputted from the output end. These transfer gates TSH91 and TSH92 constitute a holding control unit; the inverters INVH93 and INVH94 constitute a holding unit.

In the RS latch unit 102 configured in this manner, the inverters INVH93 and INVH94 constitute two inverters which receive each other's output. These inverters allow the status of the status holding nodes HQ and HQB to be held.

In a period excluding the transition period, signals SB and RB are at level H. Consequently, the transfer gates TSH91 and TSH92 are in an ON state, and the outputs of the inverters INVH93 and INVH94 are supplied to each other's input end, whereby the holding unit is configured. Accordingly, the level of the status holding nodes HQ and HQB is held.

In the transition period, one of signals SB and RB is at level L, and one of signals R and S is at level H. Consequently, the transfer gates TSH91 and TSH92 are in an OFF (locally, OFF) state, and thus the status of the status holding nodes HQ and HQB is not held. In this case, the status holding nodes HQ and HQB are changed to a level dependent on signals SB and RB by the first and second transition units.

For example, a case where, before the transition period, the node HQ is at level L and the node HQB is at level H, and when the transition period starts, signal SB changes to level L (while signal RB remains at level H), will be considered. At this time, the transfer gate TSH91 is imperfectly turned off, and the node HQ is cut off from the holding unit (when local variation in reference voltage occurs). Also, the transfer gate TSH92 is imperfectly turned on, and the node HQB is cut off from the holding unit (when local variation in power source voltage occurs). Meanwhile, when signal SB changes to level L, the transistors PMH91 and NMH92 are turned on, the transistors NMH91 and PMH92 are turned off and the status holding node HQ changes to level H and the status holding node HQB changes to level L. In contrast, in a case where, before the transition period, the node HQ is at level H and the node HQB is at level L, and when the transition period starts, signal RB changes to level L (while signal SB remains at level H), the transfer gate TSH91 is imperfectly turned on, and the node HQ is cut off from the holding unit (when local variation in power source voltage occurs). Also, the transfer gate TSH92 is imperfectly turned off, and the node HQB is cut off from the holding unit (when local variation in reference voltage occurs). Meanwhile, the transistors PMH91 and NMH92 are turned off and the transistors NMH91 and PMH92 are turned on, and the status holding node HQ changes to level L and the status holding node HQB is changes to level H.

In the example of FIG. 24, also, as each transistor disposed on the discharge paths of the pre-charge nodes PR and PB, transistors of different Vth from that of the other transistors are employed. More specifically, Vth of the NMOS transistors NML81 to NML85 disposed on the discharge paths of the pre-charge nodes PR and PB is set to a lower value than that of the other transistors. Vth of each transistor used in the inverters INVH91 to INVH94, the delay/inverting circuit 51H and the transfer gates TSH91 and TSH92 is also higher than that of the NMOS transistors NML81 to NML85.

Consequently, in the example of FIG. 24, also, while leak is reduced by use of the transistors of higher Vth, discharge can be performed in a shorter time by use of the transistors of lower Vth. That is, a circuit of higher speed operation and lower leak can be obtained. It is noted that, in the example of FIG. 24, also, the transistors NML81 to NML85 constitute a series connection of a plurality of source/drain paths, and therefore, even when Vth is relatively low, leak current can be prevented from occurring.

Figure 25:
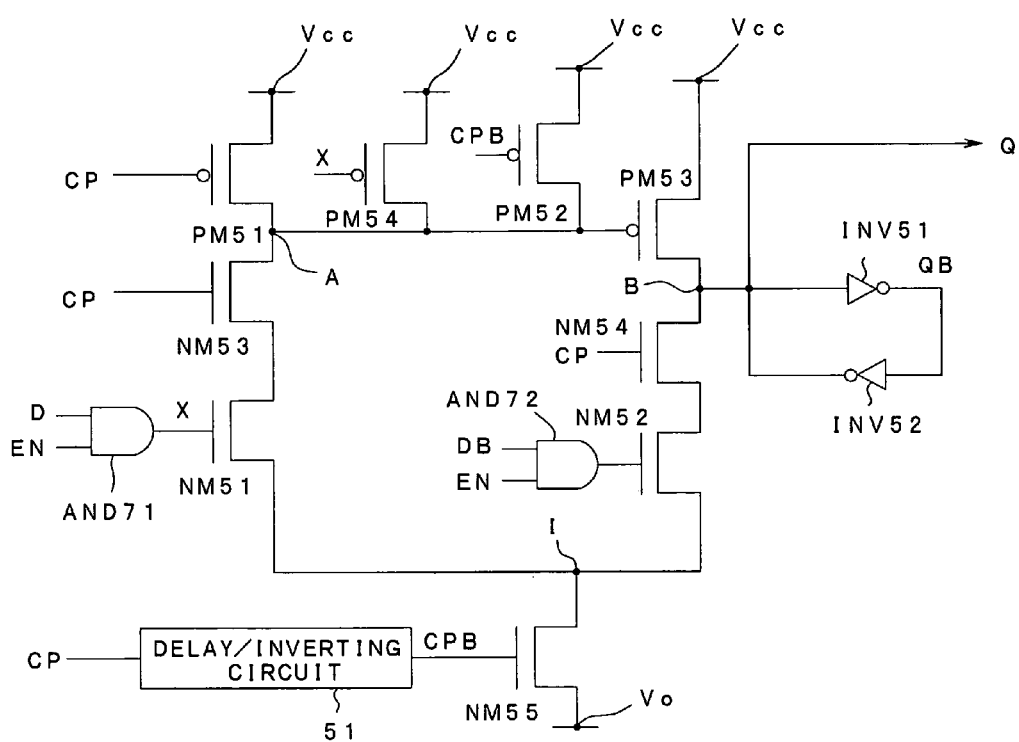
FIG. 25 is a circuit diagram showing another example of the semiconductor integrated circuit device of FIG. 19.

FIG. 25 is a circuit diagram showing another example of the semiconductor integrated circuit device of FIG. 19. In FIG. 25, the same reference characters are applied to constituent components corresponding to FIG. 19, and an explanation thereof is omitted.

The difference of the circuit of FIG. 25 from the circuit of FIG. 19 lies in that AND logic circuits AND71 and AND72 are added. The AND logic circuit AND71 receives signal D and enable signal EN, and supplies as signal X, the AND operation result between the two inputs to the gate of the transistor NM51. The AND logic circuit AND72 receives signal DB and signal EN, and supplies the AND operation result between the two inputs to the gate of the transistor NM52.

According to such configuration, when enable signal EN is at level H, the operation is similar to that of FIG. 19, and an ordinary flip-flop operation is performed. Meanwhile, when enable signal EN is at level L, level L is applied to the gates of the transistors NM51 and NM52. That is, in this case, the transistors NM51 and NM52 are in an OFF state. Consequently, the pre-charge node A is not discharged, and neither is the status holding node B. Put simply, the circuit of FIG. 25 terminates the flip-flop operation.

When enable signal EN is not used, even when data transition factor is 0%, redundant internal transition may occur each time signal CP is received. In contrast, in the configuration of FIG. 25, irrespective of signal CP, transition current does not flow in a period where signal EN is at level L, and thus electric power is not consumed. In this manner, in the circuit of FIG. 25, power consumption can be further reduced.

Also, in a period where signal EN is at level L, two transistors within the discharge path constituted of the transistors NM51, NM53 and NM55 a returned off; two transistors within the discharge path constituted of the transistors NM52, NM54 and NM55 are turned off. Accordingly, in the circuit of FIG. 25, leak current can be reduced.

In this manner, in FIG. 25, a circuit of high speed, low power consumption and low leak is obtained.

Having described the preferred embodiments of the invention referring to the accompanying drawings, it should be understood that the present invention is not limited to those precise embodiments and various charges and modifications thereof could be made by one skilled in the art without departing from the spirit or scope of the invention as defined in the appended claims.

What is claimed is:

1. A semiconductor integrated circuit device having a pulse generator outputting according to a differential input signal, a set pulse signal and a reset pulse signal, and a latch circuit outputting according to the set pulse signal and the reset pulse signal, a differential output signal, the pulse generator comprising:
a first charge/discharge path and a second charge/discharge path sharing part of a path;
a charge unit, connected to the first charge/discharge path and the second charge/discharge path, and configured to pre-charge first nodes acting as an output end of each of the set pulse signal and the reset pulse signal;
two first switching units, disposed between the first nodes and a second node on the shared path, and configured to control according to the input signal, conduction and non-conduction of the first charge/discharge path and the second charge/discharge path, respectively; and
a second switching unit, disposed between the second node and a reference voltage node, and configured to be turned on in a period prior to capturing the input signal to allow an electric charge accumulated at the second node to be discharged to the reference voltage node, and at the same time, configured to be turned on in a period of capturing the input signal to allow the first node to discharge, wherein:
the latch circuit has a status transition circuit allowing the logical status of the output signal to transit according to the set pulse signal and the reset pulse signal, and a status holding circuit for holding the logical status of an output node of the output signal of the latch circuit according to the set pulse signal and the reset pulse signal; and
the status holding circuit has a third switching unit configured to control the connection status with the output node according to a clock signal for indicating a period of capturing the input signal.

2. A semiconductor integrated circuit device having a pulse generator outputting a pulse signal according to an input signal, and a latch circuit outputting an output signal according to the pulse signal, wherein:
the pulse generator comprising:
a first charge/discharge path sharing part of a path with the latch circuit;
a first charge unit, connected to the first charge/discharge path, and configured to pre-charge a first node acting as an output end of the pulse signal;
a first switching unit, disposed between the first node and a second node on the shared path, and configured to control according to the input signal, conduction and non-conduction of the first charge/discharge path; and
a second switching unit, disposed between the second node and a reference voltage node, and configured to be turned on in a period prior to capturing the input signal to allow an electric charge accumulated at the second node to be discharged to the reference voltage node, and at the same time, configured to be turned on in a period of capturing the input signal to permit the first node to discharge, and
the latch circuit comprising:
a second charge/discharge path having the shared path;
a second charge unit, connected to the second charge/discharge path, and configured to charge according to the pulse signal, a third node acting as an output end of the output signal; and
a third switching unit, disposed between the third node and the second node, and configured to control according to the input signal, conduction and non-conduction of the second charge/discharge path.

3. The semiconductor integrated circuit device according to claim 2, wherein:
the first switching unit includes a discharge path configured to be controlled by the input signal; and
the third switching unit includes a discharge path configured to be controlled by an inverted signal of the input signal.

4. The semiconductor integrated circuit device according to claim 2, being a flip-flop allowing a level of an output node to transit in a transition period and allowing a level of the output node to be held in a period excluding the transition period, the flip-flop including:
a status holding circuit allowing a level of the output node to be held in a period excluding the transition period; and
a holding operation termination unit allowing a holding operation of the status holding circuit to terminate in the transition period.

5. The semiconductor integrated circuit device according to claim 2, further comprising:
a transistor, disposed in a discharge path of the first switching unit, and determining a transition period where discharge of the pre-charge node is permitted; and
an internal transition inhibit control unit turning off the third transistor according to logic of the input signal and logic of the output node.

6. The semiconductor integrated circuit device according to claim 2, further comprising a signal generation unit, disposed in the second switching unit, and generating a clock delay/inverting signal according to a clock signal, wherein the signal generation unit includes:
- a PMOS transistor and an NMOS transistor, connected in a complementary manner, and inverting the clock signal before outputting the clock signal; and
- a resistance component for adjusting a time constant, connected between the NMOS transistor and a reference voltage point, and varying a discharge time constant.

7. The semiconductor integrated circuit device according to claim 6, wherein the resistance component comprises a transistor.

8. The semiconductor integrated circuit device according to claim 2, further comprising:
- a switching element, disposed in the first switching unit, and inhibiting discharge by the first switching unit according to an enable signal; and
- a switching element, disposed in the third switching unit, and inhibiting discharge by the third switching unit according to an enable signal.

9. The semiconductor integrated circuit device according to claim 2, wherein transistors disposed in the first switching unit, the second switching unit and the third switching unit have lower threshold voltage Vth than that of the other transistors.

10. A semiconductor integrated circuit device having a pulse generator outputting according to a differential input signal, a set pulse signal and a reset pulse signal, and a latch circuit outputting according to the set pulse signal and the reset pulse signal, a differential output signal, the pulse generator comprising:
- a first charge/discharge path and a second charge/discharge path sharing part of a path;
- a charge unit, connected to the first charge/discharge path and the second charge/discharge path, and configured to pre-charge first nodes acting as an output end of each of the set pulse signal and the reset pulse signal;
- two first switching units, disposed between the first nodes and a second node on the shared path, and configured to control according to the input signal, conduction and non-conduction of the first charge/discharge path and the second charge/discharge path, respectively; and
- a second switching unit, disposed between the second node and a reference voltage node, and configured to be turned on in a period prior to capturing the input signal to allow an electric charge accumulated at the second node to be discharged to the reference voltage node, and at the same time, configured to be turned on in a period of capturing the input signal to allow the first node to discharge;
- wherein transistors disposed in the first switching unit and the second switching unit have lower threshold voltage Vth than that of the other transistors.

* * * * *